(12) United States Patent
Hong et al.

(10) Patent No.: US 11,182,310 B2
(45) Date of Patent: Nov. 23, 2021

(54) PRIORITY DETERMINATION CIRCUIT AND METHOD OF OPERATING THE PRIORITY DETERMINATION CIRCUIT FOR PREVENTING OVERLAPPING OPERATION

(71) Applicant: SK hynix Inc., Icheon-si (KR)

(72) Inventors: Yong Hwan Hong, Icheon-si (KR); Byung Ryul Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/930,713

(22) Filed: May 13, 2020

(65) Prior Publication Data

US 2021/0191885 A1 Jun. 24, 2021

(30) Foreign Application Priority Data

Dec. 24, 2019 (KR) .................. 10-2019-0173794

(51) Int. Cl.
| | | |
|---|---|---|
| *G06F 13/00* | (2006.01) | |
| *G06F 13/16* | (2006.01) | |
| *G06F 12/02* | (2006.01) | |
| *G06F 5/12* | (2006.01) | |
| *G06F 9/48* | (2006.01) | |
| *G11C 16/10* | (2006.01) | |
| *G06F 9/46* | (2006.01) | |

(52) U.S. Cl.
CPC ............ *G06F 13/1663* (2013.01); *G06F 5/12* (2013.01); *G06F 9/462* (2013.01); *G06F 9/4806* (2013.01); *G06F 12/0246* (2013.01); *G06F 13/1642* (2013.01); *G11C 16/10* (2013.01); *G06F 2212/7203* (2013.01)

(58) Field of Classification Search
CPC . G06F 13/1663; G06F 12/0246; G11C 16/10; G11C 5/12; G11C 9/462; G11C 9/4806; G11C 13/1642; G11C 2212/7203
See application file for complete search history.

(56) References Cited

U.S. PATENT DOCUMENTS

| | | | | |
|---|---|---|---|---|
| 4,964,034 A | * | 10/1990 | Jaskowiak | ............ G06F 13/364 710/114 |
| 5,603,001 A | * | 2/1997 | Sukegawa | ............. G06F 3/0601 711/103 |
| 6,754,765 B1 | * | 6/2004 | Chang | ........................ G06F 8/65 711/103 |
| 8,327,227 B2 | * | 12/2012 | Hu | ....................... G06F 11/0766 714/763 |
| 8,667,212 B2 | * | 3/2014 | McWilliams | ....... G06F 12/0806 711/103 |
| 2002/0003574 A1 | * | 1/2002 | Kawamura | ........ H04N 1/32587 348/222.1 |

(Continued)

FOREIGN PATENT DOCUMENTS

| | | |
|---|---|---|
| KR | 100890017 B1 | 3/2009 |
| KR | 101148722 B1 | 5/2012 |

*Primary Examiner* — Jing-Yih Shyu
(74) *Attorney, Agent, or Firm* — William Park & Associates Ltd.

(57) ABSTRACT

Provided herein may be a priority determination circuit and a method of operating the priority determination circuit. The priority determination circuit may receive request signals from a plurality of microcontrollers respectively corresponding to the plurality of planes, and output response signals corresponding to the request signals depending on a determined priority.

19 Claims, 20 Drawing Sheets

(56) References Cited

U.S. PATENT DOCUMENTS

| | | | |
|---|---|---|---|
| 2003/0182478 A1* | 9/2003 | Matsui | G06F 13/28 |
| | | | 710/22 |
| 2008/0022030 A1* | 1/2008 | Hagiwara | G06F 13/364 |
| | | | 710/308 |
| 2008/0082703 A1* | 4/2008 | Ueno | G06F 13/36 |
| | | | 710/40 |
| 2009/0225600 A1* | 9/2009 | Park | G11C 16/3418 |
| | | | 365/185.11 |
| 2010/0199025 A1* | 8/2010 | Nanjou | G06F 12/0607 |
| | | | 711/103 |

* cited by examiner

FIG. 7

| MASKING_SIG_2 | 1 | 0 | 0 |
|---|---|---|---|
| MASKING_SIG_3 | 1 | 1 | 0 |
| MASKING_SIG_4 | 1 | 1 | 1 |

# PRIORITY DETERMINATION CIRCUIT AND METHOD OF OPERATING THE PRIORITY DETERMINATION CIRCUIT FOR PREVENTING OVERLAPPING OPERATION

CROSS-REFERENCE TO RELATED APPLICATION

The present application claims priority under 35 U.S.C. § 119(a) to Korean patent application number 10-2019-0173794, filed on Dec. 24, 2019, in the Korean Intellectual Property Office, the entire disclosure of which is incorporated herein by reference.

BACKGROUND

1. Technical Field

Various embodiments of the present disclosure generally relate to an electronic device, and more particularly, to a priority determination circuit and a method of operating the priority determination circuit.

2. Related Art

A storage device is a device which stores data under the control of a host device such as a computer, a smartphone, or a smartpad. Examples of the storage device include a device such as a hard disk drive (HDD) which stores data in a magnetic disk, and a device such as a solid state drive (SSD) or a memory card which stores data in a semiconductor memory, particularly, a nonvolatile memory, according to the device in which data is stored.

The storage device may include a memory device in which data is stored and a memory controller which controls the storage of data in the memory device. Such memory devices may be classified into a volatile memory and a nonvolatile memory. Representative examples of the nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

An embodiment of the present disclosure may provide for a priority determination circuit configured to receive request signals corresponding to operations to be performed on a plurality of planes, from a plurality of microcontrollers respectively corresponding to the plurality of planes; determine a priority among the received request signals; and output response signals, the response signals corresponding to the request signals, depending on the determined priority.

An embodiment of the present disclosure may provide for a priority determination circuit. The priority determination circuit may include a request signal delay component configured to receive request signals corresponding to operations to be performed on a plurality of planes, from a plurality of microcontrollers respectively corresponding to the plurality of planes, and to output delayed request signals obtained by delaying the request signals, a write/read pointer output circuit configured to generate a write pointer and a read pointer based on the request signals and the delayed request signals to set a priority among the received request signals, a First-In, First-Out (FIFO) register configured to store data based on the write pointer and output the stored data in response to a write enable signal generated based on the write pointer, a multiplexer configured to output FIFO data based on register data output from the FIFO register and a read enable signal generated depending on the read pointer, and a response signal generator configured to output response signals for instructing any one of the plurality of microcontrollers to initiate or terminate an operation based on the FIFO data and the delayed request signals.

An embodiment of the present disclosure may provide for a method of operating a priority determination circuit. The method may include receiving request signals from a plurality of microcontrollers respectively corresponding to a plurality of planes, determining a priority among the received request signals, and outputting response signals corresponding to the request signals depending on the determined priority.

BRIEF DESCRIPTION OF THE DRAWINGS

FIG. 7 is a diagram for explaining masking signals input to the request signal delay component of FIG. 5.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure will now be described more fully hereinafter with reference to the accompanying drawings, in which preferred embodiments of the present disclosure are illustrated, so that those of ordinary skill in the art can easily carry out the technical idea of the present disclosure.

Various embodiments of the present disclosure are directed to a priority determination circuit and a method of operating the priority determination circuit, which can determine an operating sequence between a plurality of planes.

Figure 1:
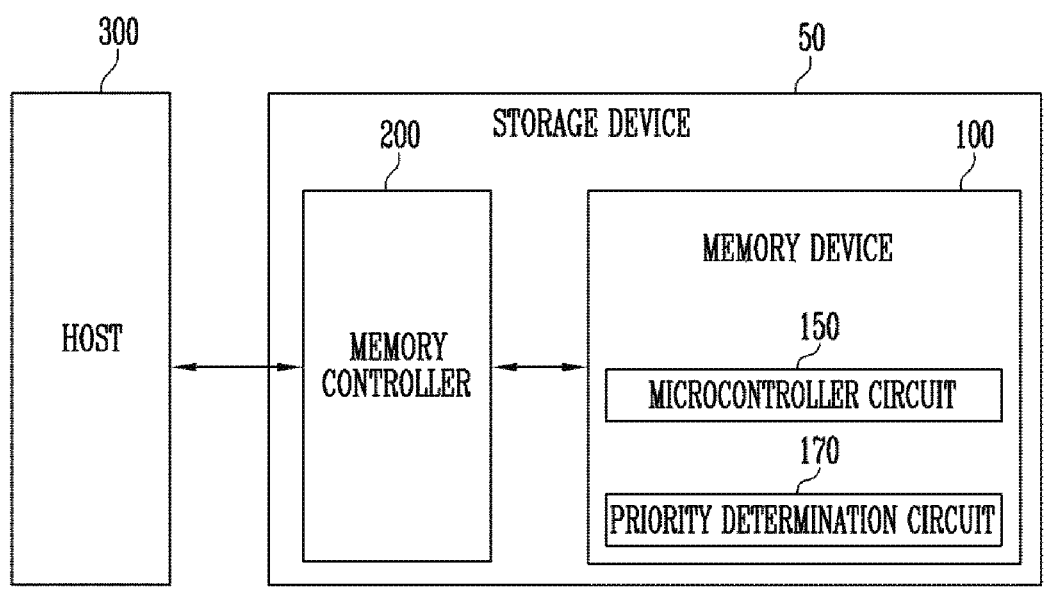
FIG. 1 is a block diagram illustrating a storage device.

FIG. 1 is a block diagram illustrating a storage device.

Referring to FIG. 1, a storage device 50 may include memory devices 100 and a memory controller 200.

The storage device 50 may be a device which stores data under the control of a host 300, such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices depending on a host interface that is a scheme for communication with the host 300. For example, the storage device 50 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells, which may constitute a plurality of pages. In an embodiment, each page may be a unit by which data is stored in the memory device 100 or by which data stored in the memory device 100 is read. A memory block may be a unit by which data is erased.

In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

The memory device 100 may be implemented in a two-dimensional (2D) array structure or a three-dimensional (3D) array structure. Hereinafter, although a 3D array structure is described as an embodiment, the present disclosure is not limited to the 3D array structure. The present disclosure may also be applied not only to a flash memory device in which a charge storage layer is formed of a conductive floating gate (FG), but also to a charge trap flash (CTF) memory device in which a charge storage layer is formed of an insulating layer.

In an embodiment, the memory device 100 may be operated in a single-level cell (SLC) manner in which one data bit is stored in one memory cell. Alternatively, the memory device 100 may be operated in a manner in which at least two data bits are stored in one memory cell. For example, the memory device 100 may be operated in a multi-level cell (MLC) manner in which two data bits are stored in one memory cell, a triple-level cell (TLC) manner in which three data bits are stored in one memory cell, or a quadruple-level cell (QLC) manner in which four data bits are stored in one memory cell.

The memory device 100 may receive a command and an address from the memory controller 200, and may access the area of the memory cell array, selected by the address. That is, the memory device 100 may perform an operation corresponding to the command on the area selected by the address. For example, the memory device 100 may perform a write operation (i.e., program operation), a read operation or an erase operation in response to the received command. When a program command is received, the memory device 100 may program data to the area selected by the address. When a read command is received, the memory device 100 may read data from the area selected by the address. When an erase command is received, the memory device 100 may erase data stored in the area selected by the address.

In an embodiment, the memory device 100 may include a microcontroller circuit 150. The microcontroller circuit 150 may include one or more microcontrollers. The microcontrollers included in the microcontroller circuit 150 may correspond to respective planes included in the memory device 100. For example, a first microcontroller included in the microcontroller circuit 150 may correspond to a first plane included in the memory device 100, and a second microcontroller included in the microcontroller circuit 150 may correspond to a second plane included in the memory device 100. That is, the first microcontroller may control the first plane so that an operation is performed on the first plane, and the second microcontroller may control the second plane so that an operation is performed on the second plane.

Therefore, the microcontroller circuit 150 may be composed of microcontrollers respectively corresponding to the planes included in the memory device 100. That is, the number of microcontrollers included in the microcontroller circuit 150 may be equal to the number of planes included in the memory device 100. Moreover, the planes are included in the memory device 100 and each of the planes is composed of a plurality of memory blocks, each including a plurality of memory cells. That is, a program operation, a read operation or an erase operation is performed on the plurality of memory blocks of the planes.

In an embodiment, the microcontroller circuit 150 may receive a command from an external device. The command received from the external device may be a command for instructing an operation to be performed on any one of the plurality of planes.

Here, when the microcontroller circuit 150 receives only a single command, there is no concern that operations of the plurality of microcontrollers included in the microcontroller circuit 150 will overlap each other.

Here, when the microcontroller circuit 150 receives two or more commands to be executed on the plurality of planes, there is concern that operations of the plurality of microcontrollers included in the microcontroller circuit 150 will overlap each other. That is, by an operation performed on any one plane, an operation currently being performed on another plane may be influenced.

In conventional technology, microcontrollers are operated such that, regardless of an overlap between the operations of the microcontrollers, when a command is received from an external device, an operation corresponding to the command is immediately performed on the corresponding plane.

However, because planes are simultaneously operated, and then the operation of each plane may influence the operations of other planes, there is a need to determine the priority between the operations of the planes.

Therefore, in the present disclosure, a priority determination circuit 170 for determining the priority between the microcontrollers included in the microcontroller circuit 150 before the microcontrollers are operated may be included in the memory device 100.

In an embodiment, the memory device 100 may include the priority determination circuit 170. The priority determination circuit 170 may determine the priority between the microcontrollers included in the microcontroller circuit 150. That is, the priority determination circuit 170 may control the microcontrollers so that, when the operation of any one microcontroller is terminated, another microcontroller may be operated.

For example, the priority determination circuit 170 may control the microcontrollers in the sequence of the first microcontroller, the second microcontroller, the third microcontroller, and the fourth microcontroller. That is, when the operations of the first microcontroller and the second microcontroller overlap each other, the priority determination circuit 170 may control the microcontrollers so that the first microcontroller is operated first. When the operations of the second microcontroller and the third microcontroller overlap each other, the priority determination circuit 170 may control the microcontrollers so that the second microcontroller is operated first. When the operations of the third microcontroller and the fourth microcontroller overlap each other, the priority determination circuit 170 may control the microcontrollers so that the third microcontroller is operated first.

However, the priority determination circuit 170 may control the microcontrollers so that, when the operations of the microcontrollers do not overlap each other, the microcontrollers are operated in the sequence of requests received from the microcontrollers. That is, when a request from a next microcontroller is received after the operation of any one of the first to fourth microcontrollers has been terminated, the priority determination circuit 170 may control the microcontrollers so that the microcontrollers are operated in the sequence of received requests.

In an embodiment, when the operations of the microcontrollers overlap each other, the priority determination circuit 170 may determine the priority between the microcontrollers, and may output a response signal depending on the determined priority. Among the first to fourth microcontrollers, a microcontroller corresponding to the response signal may be operated first. As described above, response signals may be output in the sequence of the first microcontroller, the second microcontroller, the third microcontroller, and the fourth microcontroller.

In an embodiment, the priority determination circuit 170 may set write pointers and read pointers to determine the priority between the microcontrollers. The write pointers and the read pointers may be determined based on request signals and delayed request signals. Further, the bit to be stored in a First-In, First-Out (FIFO) register and the value to be output from a multiplexer may be set based on the write pointers and the read pointers, and response signals may be output from the priority determination circuit 170 based on the set bit and value. That is, depending on the determined priority, the response signals may be output from the priority determination circuit 170.

The memory controller 200 may control the overall operation of the storage device 50.

When a supply voltage is applied to the storage device 50, the memory controller 200 may run firmware (FW). When the memory device 100 is a flash memory device 100, the memory controller 200 may run firmware such as a Flash Translation Layer (FTL) for controlling communication between the host 300 and the memory device 100.

In an embodiment, the memory controller 200 may include firmware (not illustrated) which may receive data and a logical block address (LBA) from the host 300, and may translate the logical block address (LBA) into a physical block address (PBA) indicating the address of memory cells which are included in the memory device 100 and in which data is to be stored. Further, the memory controller 200 may store a logical-physical address mapping table, which configures mapping relationships between logical block addresses (LBA) and physical block addresses (PBA), in the buffer memory.

The memory controller 200 may control the memory device 100 so that a program operation, a read operation or an erase operation is performed in response to a request received from the host 300. For example, when a program request is received from the host 300, the memory controller 200 may convert the program request into a program command, and may provide the program command, a physical block address (PBA), and data to the memory device 100. When a read request together with a logical block address is received from the host 300, the memory controller 200 may convert the read request into a read command, select a physical block address corresponding to the logical block address, and thereafter provide the read command and the physical block address (PBA) to the memory device 100. When an erase request together with a logical block address is received from the host 300, the memory controller 200 may convert the erase request into an erase command, select a physical block address corresponding to the logical block address, and thereafter provide the erase command and the physical block address (PBA) to the memory device 100.

In an embodiment, the memory controller 200 may autonomously generate a program command, an address, and data without receiving a request from the host 300, and may transmit them to the memory device 100. For example, the memory controller 200 may provide commands, addresses, and data to the memory device 100 to perform background operations, such as a program operation for wear leveling and a program operation for garbage collection.

In an embodiment, the storage device 50 may include a buffer memory (not illustrated). The memory controller 200 may control data exchange between the host 300 and the buffer memory (not illustrated). Alternatively, the memory controller 200 may temporarily store system data for controlling the memory device 100 in the buffer memory (not illustrated). For example, the memory controller 200 may temporarily store data, input from the host 300, in the buffer memory, and may then transmit the data, temporarily stored in the buffer memory, to the memory device 100.

In various embodiments, the buffer memory may be used as a working memory or a cache memory for the memory controller 200. The buffer memory may store codes or commands that are executed by the memory controller 200. Alternatively, the buffer memory may store data that is processed by the memory controller 200.

In an embodiment, the buffer memory may be implemented as a DRAM such as a double data rate SDRAM (DDR SDRAM), a double data rate fourth generation (DDR4) SDRAM, a low power double data rate fourth generation (LPDDR4) SDRAM, a graphics double data rate (GDDR) SDRAM, a low power DDR (LPDDR) SDRAM, or a Rambus DRAM (RDRAM), or as a static RAM (SRAM).

In various embodiments, the buffer memory may be coupled to the storage device 50 outside the storage device 50. In this case, volatile memory devices coupled to the outside of the storage device 50 may function as the buffer memory.

In an embodiment, the memory controller 200 may control at least two memory devices. In this case, the memory controller 200 may control the memory devices depending on an interleaving scheme to improve operating performance.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
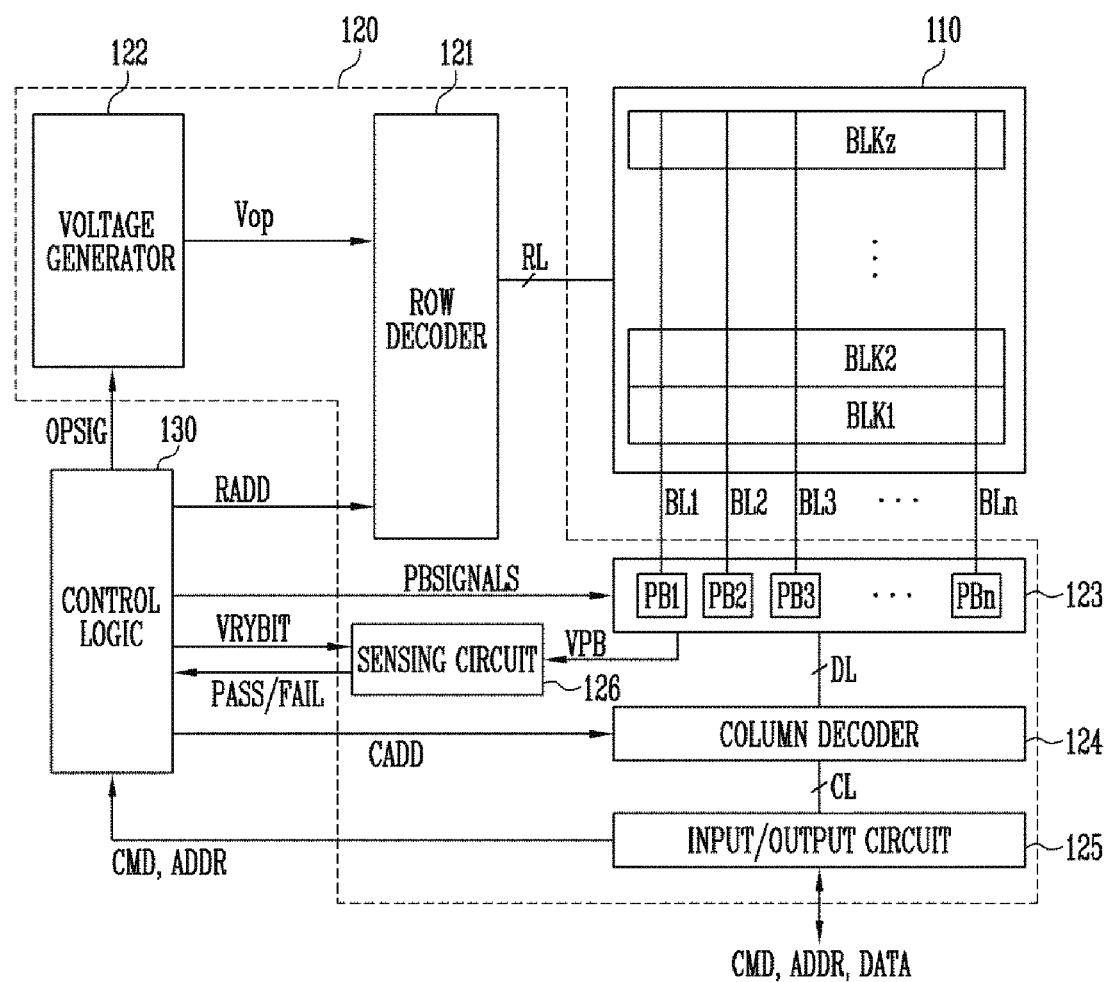
FIG. 2 is a diagram illustrating the structure of a memory device of FIG. 1.

FIG. 2 is a diagram illustrating the structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are coupled to a row decoder 121 through row lines RL. Each of the memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as a single page. Therefore, a single memory block may include a plurality of pages.

The row lines RL may include at least one source select line, a plurality of word lines, and at least one drain select line.

Each of the memory cells included in the memory cell array 110 may be implemented as a single-level cell (SLC) capable of storing one data bit, a multi-level cell (MLC) capable of storing two data bits, a triple-level cell (TLC) capable of storing three data bits, or a quadruple-level cell (QLC) capable of storing four data bits.

The peripheral circuit 120 may perform a program operation, a read operation, or an erase operation on a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 is coupled to the memory cell array 110 through the row lines RL. The row lines RL may include the at least one source select line, the plurality of word lines, and the at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 selects at least one of the memory blocks BLK1 to BLKz according to the decoded address. Further, the row decoder 121 may select at least one word line WL of the selected memory block so that voltages generated by the voltage generator 122 are applied to the at least one word line WL according to the decoded address.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory device 100 is performed on a memory block basis. During an erase operation, the row decoder 121 may select one memory block according to the decoded address. During the erase operation, the row decoder 121 may apply a ground voltage to word lines coupled to the selected memory block.

The voltage generator 122 may be operated under the control of the control logic 130. The voltage generator 122 may generate a plurality of voltages using an external supply voltage provided to the memory device 100. In detail, the voltage generator 122 may generate various operating voltages Vop that are used for program, read, and erase operations in response to an operation signal OPSIG. For example, the voltage generator 122 may generate a program voltage, a verify voltage, a pass voltages, a read voltage, an erase voltage, etc. under the control of the control logic 130.

In an embodiment, during a program operation, the voltage generator 122 may generate a program voltage and a program pass voltage, and thereafter generate a program pass voltage to be applied to all word lines. However, because the time required for the program operation may be lengthened due to the duration of the pass voltage, the operation of the voltage generator 122 for shortening the program operation time is disclosed in the present disclosure.

For example, the voltage generator 122 may generate a channel initialization voltage and a drain/source line voltage to be applied to individual lines either at the same time that the pass voltage duration starts or during the pass voltage duration. The channel initialization voltage may be a voltage which initiates a channel initialization operation and is to be applied to word lines, and the drain/source line voltage may be a voltage, which is to be applied to all drain select lines and all source select lines during the channel initialization operation.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage.

For example, the voltage generator 122 may include a plurality of pumping capacitors for receiving the internal supply voltage and generate a plurality of voltages by selectively enabling the plurality of pumping capacitors under the control of the control logic 130.

The generated voltages may be supplied to the memory cell array 110 by the row decoder 121.

The page buffer group 123 includes first to nth page buffers PB1 to PBn. The first to nth page buffers PB1 to PBn are coupled to the memory cell array 110 through the first to nth bit lines BL1 to BLn. The first to nth page buffers PB1 to PBn are operated under the control of the control logic 130. In detail, the first to nth page buffers PB1 to PBn may be operated in response to page buffer control signals PBSIGNALS. For example, the first to nth page buffers PB1 to PBn may temporarily store data received through the first to nth bit lines BL1 to BLn or may sense voltages or currents of the bit lines BL1 to BLn during a read or verify operation.

In detail, during a program operation, when the program voltage is applied to the selected word line, the first to nth page buffers PB1 to PBn may transfer the data DATA, received through the input/output circuit 125, to selected memory cells through the first to nth bit lines BL1 to BLn. The memory cells in the selected page are programmed based on the received data DATA. During a program verify operation, the first to nth page buffers PB1 to PBn may read page data by sensing the voltages or currents received through the first to nth bit lines BL1 to BLn from the selected memory cells.

During a read operation, the first to nth page buffers PB1 to PBn may read data DATA from the memory cells in the selected page through the first to nth bit lines BL1 to BLn, and may output the read data DATA to the input/output circuit 125 under the control of the column decoder 124.

During the erase operation, the first to nth page buffers PB1 to PBn may allow the first to nth bit lines BL1 to BLn to float or may apply the erase voltage to the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL or may exchange data with the input/output circuit 125 through column lines CL.

The input/output circuit 125 may transfer a command CMD and an address ADDR, received from the memory controller (e.g., 200 of FIG. 1) described above with reference to FIG. 1, to the control logic 130, or may exchange data DATA with the column decoder 124.

During a read operation or a verify operation, the sensing circuit 126 may generate a reference current in response to an enable bit VRYBIT, and may compare a sensing voltage VPB received from the page buffer group 123 with a reference voltage generated by the reference current and then output a pass signal PASS or a fail signal FAIL.

The control logic 130 may control the peripheral circuit 120 by outputting the operation signal OPSIG, the row address RADD, the page buffer control signals PBSIGNALS, and the enable bit VRYBIT in response to the command CMD and the address ADDR. For example, the control logic 130 may control a read operation on a selected memory block in response to a sub-block read command and an address. Also, the control logic 130 may control an erase operation on a selected sub-block included in a selected memory block in response to a sub-block erase command and an address. In addition, the control logic 130 may determine whether a verify operation has passed or failed in response to the pass or fail signal PASS or FAIL.

The memory cells included in the memory cell array 110 may be programmed to any one of a plurality of program states depending on the data stored in each memory cell. A target program state of the corresponding memory cell may be determined to be any one of the plurality of program states depending on the data to be stored.

Figure 3:
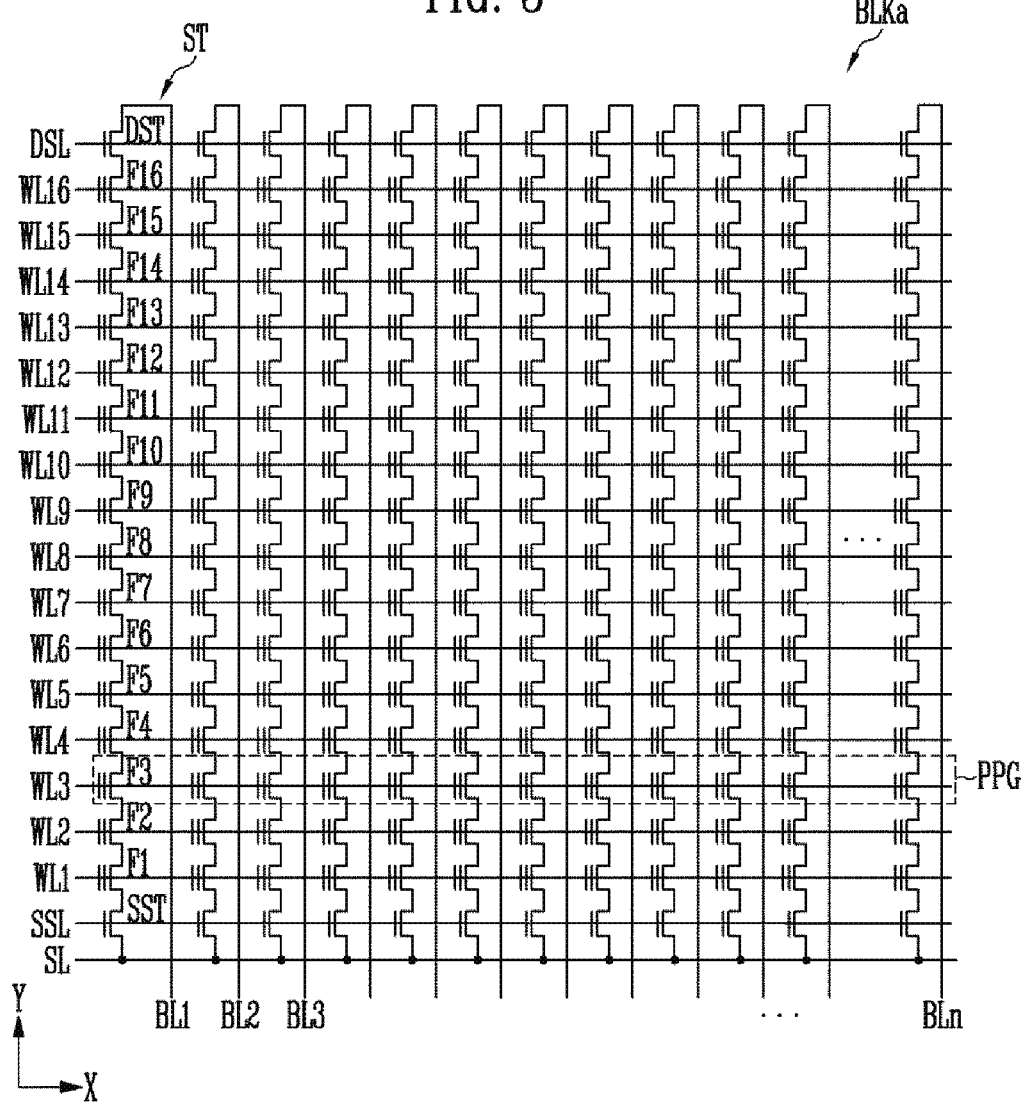
FIG. 3 is a diagram illustrating a memory block.

FIG. 3 is a diagram illustrating a memory block.

Referring to FIGS. 2 and 3, FIG. 3 is a circuit diagram illustrating any one memory block BLKa of a plurality of memory blocks BLK1 to BLKz included in the memory cell array 110 of FIG. 2.

The memory block BLKa may be coupled to a first select line, word lines, and a second select line that are coupled in parallel to each other. For example, the word lines may be coupled in parallel to each other between the first and second select lines. Here, the first select line may be a source select line SSL, and the second select line may be a drain select line DSL.

In detail, the memory block BLKa may include a plurality of strings coupled between bit lines BL1 to BLn and a source line SL. The bit lines BL1 to BLn may be coupled to the strings, respectively, and the source line SL may be coupled in common to the strings. Because the strings may be equally configured, a string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors included in different strings ST may be coupled to the source select line SSL, gates of the drain select transistors included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKa may include a number of physical pages PPG identical to the number of word lines WL1 to WL16.

One memory cell may store one bit of data. This cell is typically designated as a "single-level cell: SLC". Here, one physical page PPG may store data corresponding to one logical page LPG. The data corresponding to one logical page LPG may include a number of data bits identical to the number of memory cells included in one physical page PPG. Alternatively, one memory cell may store two or more bits of data. This cell is typically designated as a "multi-level cell: MLC". Here, one physical page PPG may store data corresponding to two or more logical pages LPG.

A memory cell in which two or more bits of data are stored in one memory cell is called a multi-level cell (MLC). However, recently, as the number of data bits stored in one memory cell increases, the multi-level cell (MLC) refers to a memory cell in which two bits of data are stored, and thus a memory cell in which three or more bits of data are stored is called a triple-level cell (TLC) and a memory cell in which four or more bits of data are stored is called a quadruple-level cell (QLC). In addition, a memory cell scheme in which multiple bits of data are stored has been developed, and the present embodiment may be applied to the memory device 100 in which two or more bits of data are stored.

In an embodiment, each of the memory blocks may have a three-dimensional (3D) structure. Each of the memory blocks may include a plurality of memory cells stacked on a substrate. The plurality of memory cells are arranged in +X, +Y, and +Z directions.

Figure 4:
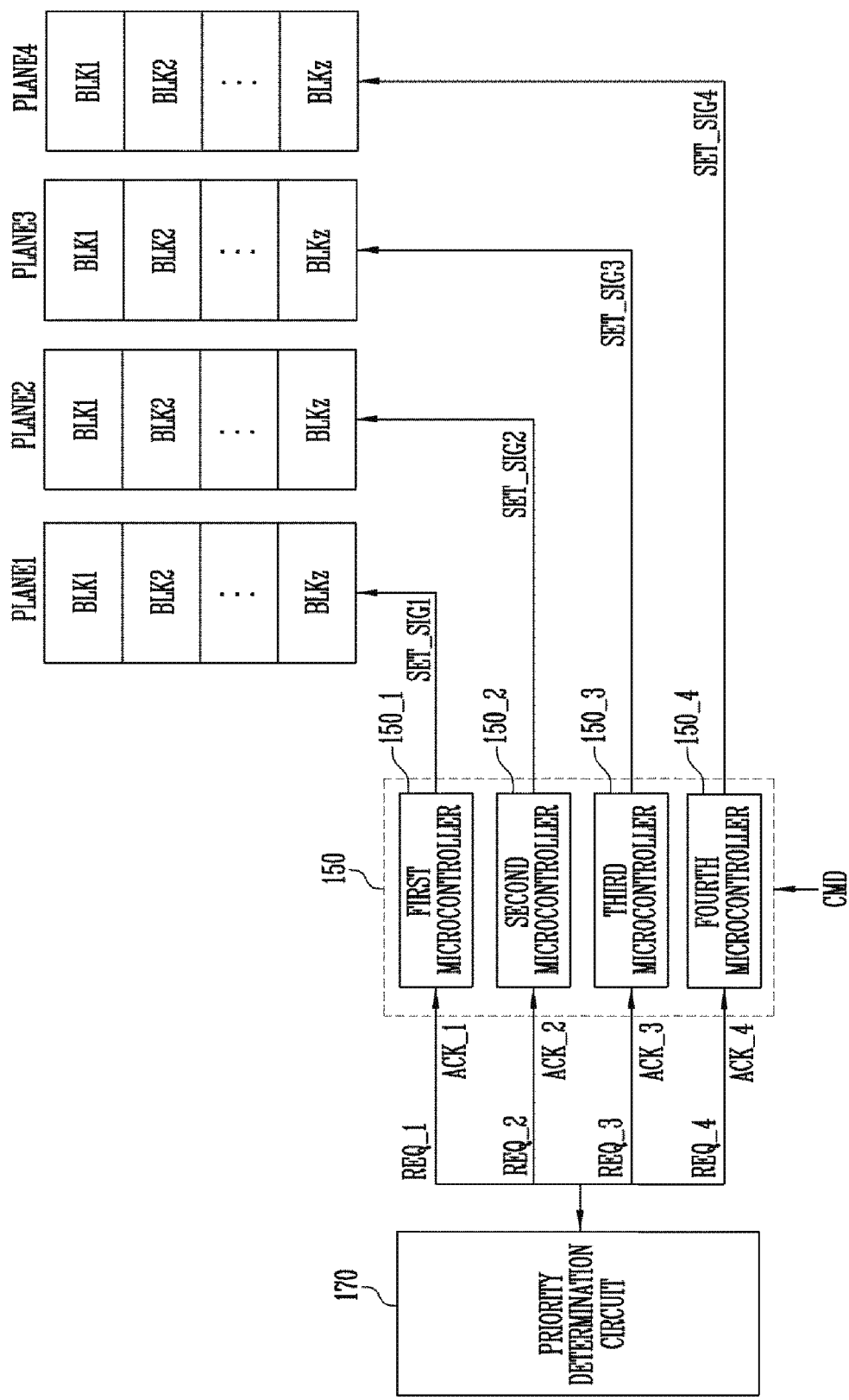
FIG. 4 is a diagram illustrating microcontrollers respectively corresponding to a plurality of planes and a priority determination circuit.

FIG. 4 is a diagram illustrating microcontrollers respectively corresponding to a plurality of planes and a priority determination circuit.

Referring to FIG. 4, some of components included in the memory device of FIG. 1 (e.g., 100 of FIG. 1) are illustrated in FIG. 4. In FIG. 4, it is assumed that the memory device includes four planes PLANE1 to PLANE4. Each of the first to fourth planes PLANE1 to PLANE4 may include first to z-th memory blocks BLK1 to BLKz. In the first to z-th memory blocks BLK1 to BLKz included in each plane, data may be stored.

In an embodiment, the memory device may include more or fewer planes.

The microcontroller circuit 150 of FIG. 4 may include first to fourth microcontrollers 150_1 to 150_4. The first microcontroller 150_1, the second microcontroller 150_2, the third microcontroller 150_3, and the fourth microcontroller 150_4 may correspond to the first plane PLANE1, the second plane PLANE2, the third plane PLANE3, and the fourth plane PLANE4, respectively.

In an embodiment, the microcontroller circuit 150 may receive a command CMD from an external device. The command CMD received from the external device may be a command for instructing an operation to be performed on any one of the first to fourth planes PLANE1 to PLANE4.

Therefore, a microcontroller corresponding to the received command CMD, among the first to fourth microcontrollers 150_1 to 150_4, may output a set signal for performing an operation on the corresponding plane. Based on the set signal, voltages, such as a program voltage, a read voltage, and a pass voltage, may be set, or an operation, such as a discharge operation or a precharge operation, may be performed.

For example, when the command CMD received from the external device is a command for instructing a program operation to be performed on the first plane PLANE1, the corresponding command CMD may be transferred to the first microcontroller 150_1, among the microcontrollers included in the microcontroller circuit 150. Also, the first microcontroller 150_1 may output a first set signal SET_SIG1 for setting a program voltage, a pass voltage, a bit line voltage, etc. so that the operation corresponding to the received command CMD is performed on the first plane PLANE1.

When the command CMD received from the external device is a command for instructing an operation to be performed on the second plane PLANE2, the command CMD may be transferred to the second microcontroller 150_2, and the second microcontroller 150_2 may output a second set signal SET_SIG2 for performing an operation corresponding to the command CMD. When the command CMD received from the external device is a command for instructing an operation to be performed on the third plane PLANE3, the command CMD may be transferred to the third microcontroller 150_3, and the third microcontroller 150_3 may output a third set signal SET_SIG3 for performing an operation corresponding to the command CMD. When the command CMD received from the external device is a command for instructing an operation to be performed on the fourth plane PLANE4, the command CMD may be transferred to the fourth microcontroller 150_4, and the fourth microcontroller 150_4 may output a fourth set signal SET_SIG4 for performing an operation corresponding to the command CMD.

In an embodiment, before the first to fourth microcontrollers 150_1 to 150_4 output the first to fourth set signals SET_SIG1 to SET_SIG4, the first to fourth microcontrollers 150_1 to 150_4 may output first to fourth request signals REQ_1 to REQ_4 to the priority determination circuit 170. That is, the first to fourth microcontrollers 150_1 to 150_4 may output the request signals REQ_1 to REQ_4 to the priority determination circuit 170 to determine a microcontroller on which an operation is to be preferentially performed before the operation corresponding to the command CMD is performed. Each of the request signals REQ_1 to REQ_4 may be a signal in a high state or a low state. Also, the first to fourth microcontrollers 150_1 to 150_4 may output the request signals in the sequence of reception of the command CMD from the external device.

In an embodiment, before the first to fourth microcontrollers 150_1 to 150_4 perform the operations, the first to fourth microcontrollers 150_1 to 150_4 may output request signals REQ_1 to REQ_4 in a high state. In contrast, when the first to fourth microcontrollers 150_1 to 150_4 complete the performance of the operations, the first to fourth microcontrollers 150_1 to 150_4 may output request signals REQ_1 to REQ_4 in a low state. The priority determination circuit 170 may determine the priority of operations in response to the request signals REQ_1 to REQ_4 in a high or low state.

Furthermore, the priority determination circuit 170 may output a response signal in a high state (or a high-state response signal) in response to a request signal in a high state (or a high-state request signal), and may output a response signal in a low state (or a low-state response signal) in response to a request signal in a low state (or a low-state request signal).

In an embodiment, the priority determination circuit 170 may receive the first to fourth request signals REQ_1 to REQ_4 in a high state or a low state from the first to fourth microcontrollers 150_1 to 150_4. The priority determination circuit 170 may determine the microcontroller on which an operation is to be preferentially performed, among the first to fourth microcontrollers 150_1 to 150_4, in response to the received first to fourth request signals REQ_1 to REQ_4.

For example, the priority determination circuit 170 may receive any one request signal in a high state, among the first to fourth request signals REQ_1 to REQ_4, or may simultaneously receive two or more request signals in a high state, among the first to fourth request signals REQ_1 to REQ_4.

When the priority determination circuit 170 receives only one request signal in a high state, among the first to fourth request signals REQ_1 to REQ_4, the priority determination circuit 170 does not need to determine a priority, and may thus output a high-state response signal in response to the received request signal. Here, a first response signal ACK_1 in a high state may be a signal for instructing the first microcontroller 150_1 to initiate an operation, a second response signal ACK_2 in a high state may be a signal for instructing the second microcontroller 150_2 to initiate an operation, a third response signal ACK_3 in a high state may be a signal for instructing the third microcontroller 150_3 to initiate an operation, and a fourth response signal ACK_4 in a high state may be a signal for instructing the fourth microcontroller 150_4 to initiate an operation.

That is, when only one request signal in a high state is received, the priority determination circuit 170 may output a response signal for allowing an operation corresponding to the command CMD received from the external device to be immediately performed, without determining a priority. When the response signal is received from the priority determination circuit 170, the corresponding microcontroller may output a set signal for performing an operation corresponding to the command CMD.

When the priority determination circuit 170 simultaneously receives two or more request signals in a high state, among the first to fourth request signals REQ_1 to REQ_4, the priority determination circuit 170 may need to determine the priority between the microcontrollers. That is, the priority determination circuit 170 may select a microcontroller on which an operation is to be preferentially performed so that operations are not simultaneously performed on the plurality of planes. Here, the priority determination circuit 170 may determine the priority in the sequence of the first microcontroller 150_1, the second microcontroller 150_2, the third microcontroller 150_3, and the fourth microcontroller 150_4. The priority determination circuit 170 may output a response signal in a high state depending on the determined priority.

In an embodiment, when the first to fourth microcontrollers 150_1 to 150_4 complete the operations, the first to fourth microcontrollers 150_1 to 150_4 may output the first to fourth request signals REQ_1 to REQ_4 in a low state. The priority determination circuit 170 may output response signals in a low state in response to the first to fourth request signals REQ_1 to REQ_4 in a low state. In this case, the priority determination circuit 170 may output a low-state response signal corresponding to the microcontroller for which the operation has been completed while outputting a high-state response signal corresponding to a microcontroller on which an operation is to be subsequently performed. That is, the low-state response signal and the high-state response signal are simultaneously output, and thus operations may be successively performed on the plurality of planes while preventing the operations of the plurality of planes from overlapping each other.

Figure 5:
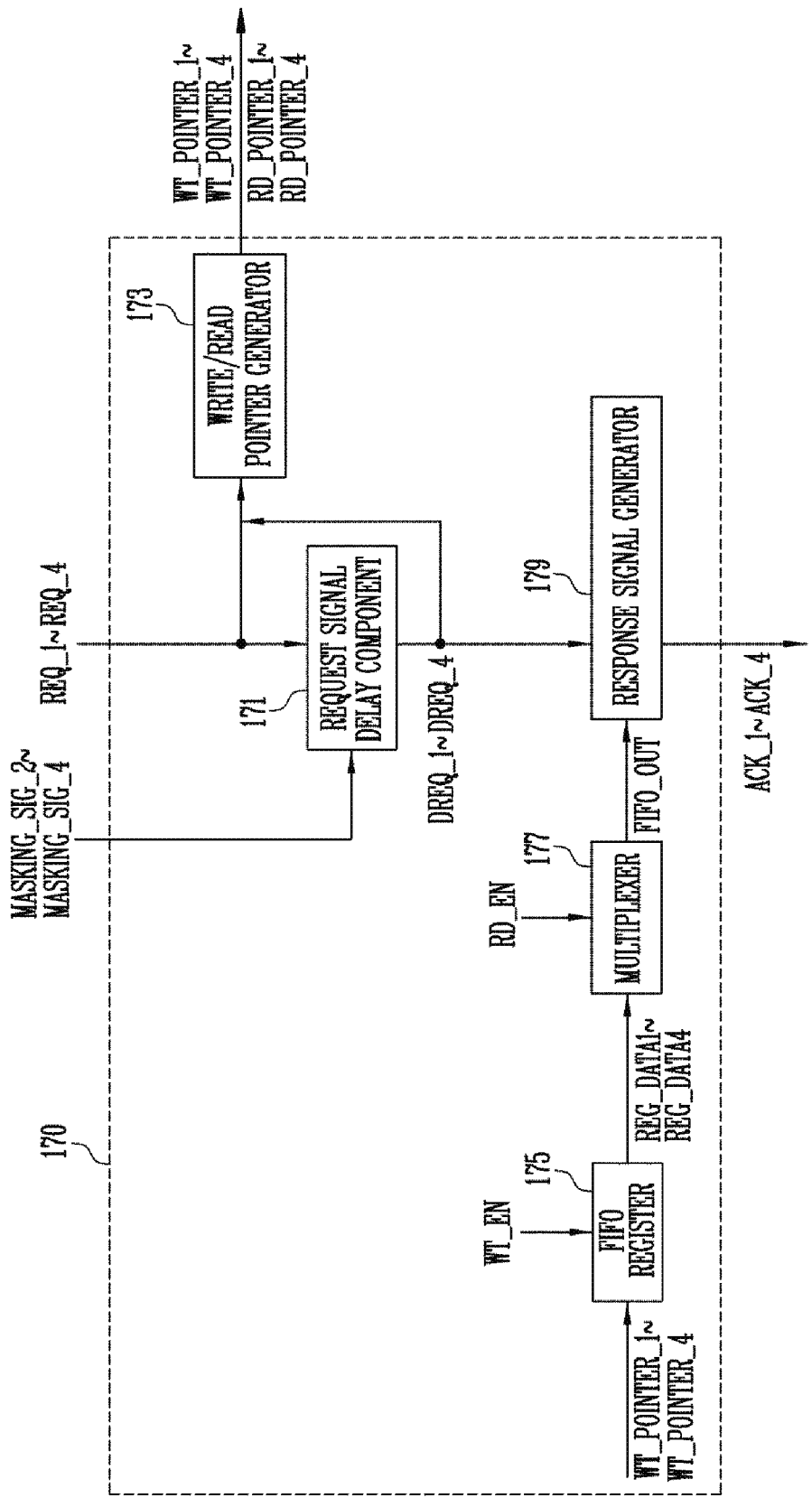
FIG. 5 is a diagram illustrating the configuration of the priority determination circuit of FIG. 4.

FIG. 5 is a diagram illustrating the configuration of the priority determination circuit of FIG. 4.

Referring to FIG. 5, the priority determination circuit 170 of FIG. 5 may include a request signal delay component 171, a write/read pointer generator 173, a First-In, First-Out (FIFO) register 175, a multiplexer 177, and a response signal generator 179. Individual components included in the priority determination circuit 170 will be described later with reference to FIGS. 6 to 8.

In an embodiment, the request signal delay component 171 may receive the first to fourth request signals REQ_1 to REQ_4, and may output first to fourth delayed request signals DREQ_1 to DREQ_4, obtained by delaying the received request signals REQ_1 to REQ_4. The first to fourth request signals REQ_1 to REQ_4 may be received from first to fourth microcontrollers 150_1 to 150_4, respectively. Each of the first to fourth request signals REQ_1 to REQ_4 may be in a high state or a low state.

In an embodiment, the request signal delay component 171 may receive masking signals MASKING_SIG_2 to MASKING_SIG_4, together with the first to fourth request signals REQ_1 to REQ_4. The masking signals MASKING_SIG_2 to MASKING_SIG_4 may be signals for preventing the microcontrollers from simultaneously performing operations. As used herein, the tilde "~" indicates a range of components. For example, "MASKING_SIG_2~MASKING_SIG_4" indicates the masking signals MASKING_SIG_2, MASKING_SIG_3, and MASKING_SIG_4, shown in FIG. 5.

For example, the request signal delay component 171 may simultaneously receive the first and second request signals REQ_1 and REQ_2 in a high state from the first and second microcontrollers 150_1 and 150_2, respectively. That is, the request signal delay component 171 may simultaneously receive request signals for instructing operations to be performed on first and second planes. In this case, the masking signals MASKING_SIG_2 to MASKING_SIG_4, corresponding to microcontrollers on which operations are not performed, may have a default value of '1'. Here, because the first microcontroller 150_1 performs an operation prior to other microcontrollers, a masking signal corresponding to the first microcontroller 150_1 might not be present.

When the second to fourth masking signals MASKING_SIG_2 to MASKING_SIG_4 are '1', the delayed request signals DREQ_2 to DREQ_4 may be output as signals in a low state.

For example, when the request signal delay component 171 simultaneously receives the first and second request signals REQ_1 and REQ_2 in a high state from the first and second microcontrollers 150_1 and 150_2, respectively, the second masking signal MASKING_SIG_2 corresponding to the second request signal REQ_2 may be in a high state. That is, the second masking signal MASKING_SIG_2 corresponding to the second request signal REQ_2 may be in a high state such that the first microcontroller 150_1 is preferentially operated. Therefore, the first delayed request signal DREQ_1 corresponding to the first request signal REQ_1 may be delayed and output in a high state, but the second delayed request signal DREQ_2 corresponding to the second request signal REQ_2 may be delayed and output in a low state.

Consequently, when the request signal delay component 171 simultaneously receives high-state request signals from the plurality of microcontrollers, the delayed request signals are set in response to the second to fourth masking signals MASKING_SIG_2 to MASKING_SIG_4, and thus the priority between the operations of the microcontroller may be determined.

In an embodiment, the write/read pointer generator 173 may receive the first to fourth request signals REQ_1 to REQ_4 and the first to fourth delayed request signals DREQ_1 to DREQ_4, obtained by delaying the first to fourth request signals REQ_1 to REQ_4, respectively. The write/read pointer generator 173 may generate first to fourth write pointers WT_POINTER_1 to WT_POINTER_4 and first to fourth read pointers RD_POINTER_1 to RD_POINTER_4 based on the first to fourth request signals REQ_1 to REQ_4 and the first to fourth delayed request signals DREQ_1 to DREQ_4. The write/read pointer generator 173 may output the first to fourth write pointers WT_POINTER_1 to WT_POINTER_4 to the FIFO register 175, and may output the first to fourth read pointers RD_POINTER_1 to RD_POINTER_4.

In an embodiment, data may be stored in the FIFO register 175 based on the first to fourth write pointers WT_POINTER_1 to WT_POINTER_4, and the states of first to fourth response signals ACK_1 to ACK_4 may be determined based on the stored data. Furthermore, although the states of the first to fourth response signals ACK_1 to ACK_4 are determined based on the first to fourth write pointers WT_POINTER_1 to WT_POINTER_4, the states of the first to fourth response signals ACK_1 to ACK_4 may be additionally determined based on the first to fourth read pointers RD_POINTER_1 to RD_POINTER_4.

In an embodiment, the FIFO register 175 may receive the first to fourth write pointers WT_POINTER_1 to WT_POINTER_4 from the write/read pointer generator 173. Further, the FIFO register 175 may receive a write enable signal WT_EN generated based on the first to fourth write pointers WT_POINTER_1 to WT_POINTER_4. The write enable signal WT_EN may be generated by the write/read pointer generator 173 or by another component (not illustrated) in the priority determination circuit 170. A default data value for the write enable signal WT_EN may be '00'.

The FIFO register 175 may store any one of pieces of first to fourth register data REG_DATA1 to REG_DATA4 whenever any one of the first to fourth write pointers WT_POINTER_1 to WT_POINTER_4, which changes from a high state to a low state, is received. The stored first to fourth register data REG_DATA1 to REG_DATA4 may be output to the multiplexer 177. In this case, the FIFO register 175 may determine register data to be output to the multiplexer 177 in response to the write enable signal WT_EN.

In an embodiment, the multiplexer 177 may receive a read enable signal RD_EN, which is generated based on the first to fourth read pointers RD_POINTER_1 to RD_POINTER_4, and the first to fourth register data REG_DATA1 to REG_DATA4 which are output from the FIFO register 175. The read enable signal RD_EN may be generated by the write/read pointer generator 173 or by another component (not illustrated) in the priority determination circuit 170. A default data value for the read enable signal RD_EN may be '00'.

The multiplexer 177 may output the first to fourth register data REG_DATA1 to REG_DATA4 as FIFO data FIFO_OUT to the response signal generator 179 in response to the read enable signal RD_EN.

In an embodiment, the response signal generator 179 may receive the first to fourth delayed request signals DREQ_1 to DREQ_4 from the request signal delay component 171 and receive the FIFO data FIFO_OUT from the multiplexer 177. Therefore, the response signal generator 179 may generate the first to fourth response signals ACK_1 to ACK_4 based on the first to fourth delayed request signals DREQ_1 to DREQ_4 and the FIFO data FIFO_OUT, and may output the first to fourth response signals ACK_1 to ACK_4 to the microcontroller circuit 150. Here, the priority between the microcontrollers may be determined based on the first to fourth response signals ACK_1 to ACK_4 output from the response signal generator 179.

Figure 6:
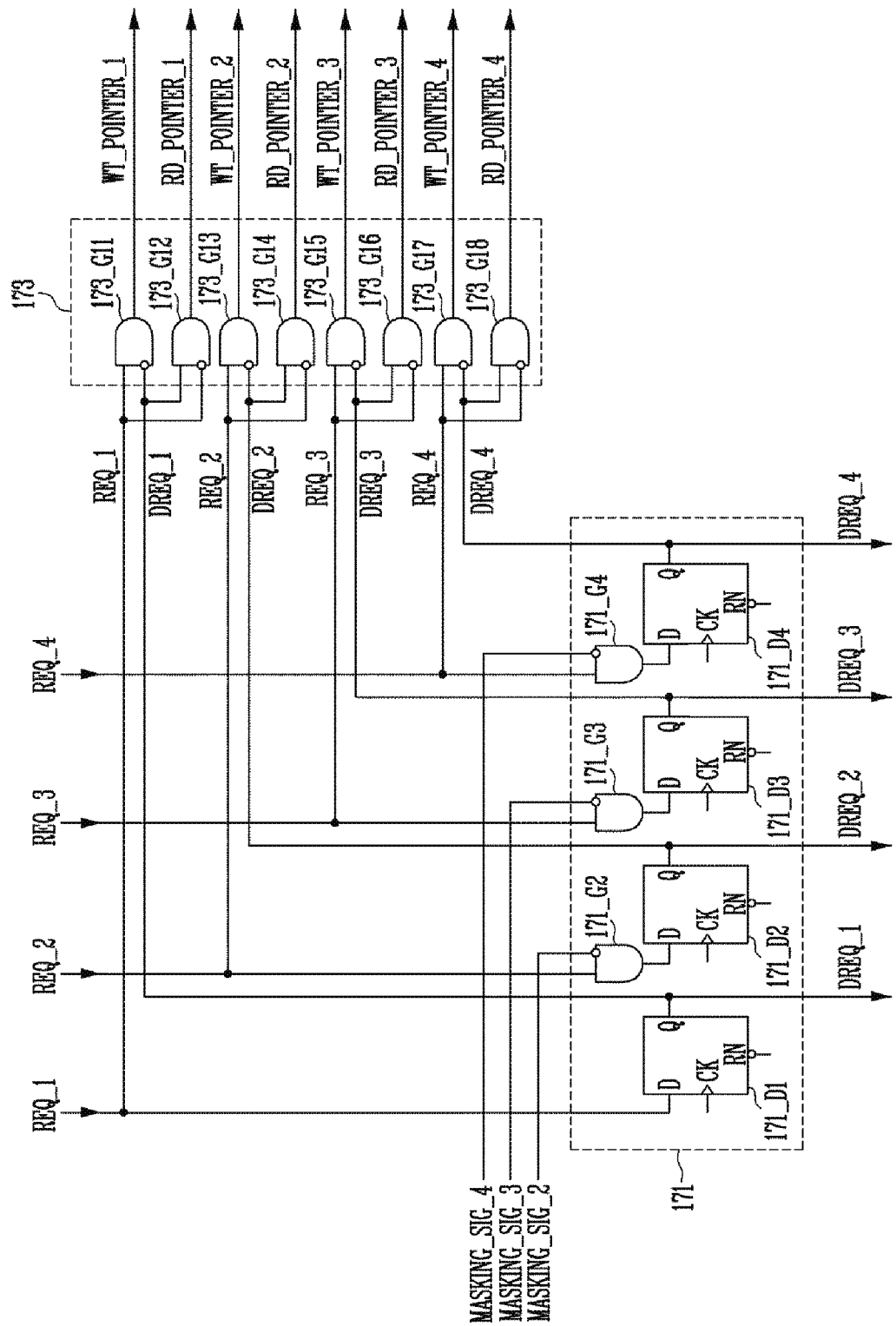
FIG. 6 is a diagram illustrating a request signal delay component and a write/read pointer generator of FIG. 5.

FIG. 6 is a diagram illustrating the request signal delay component and the write/read pointer generator of FIG. 5.

Referring to FIG. 6, the request signal delay component 171 of FIG. 6 may include D flip-flops and logic gates which correspond to first to fourth microcontrollers 150_1 to 150_4 included in the microcontroller circuit of FIG. 4 (e.g., 150 of FIG. 4). The write/read pointer generator 173 of FIG. 6 may include logic gates respectively corresponding to the first to fourth microcontrollers 150_1 to 150_4 included in the microcontroller circuit of FIG. 4 (e.g., 150 of FIG. 4). Each of the second to fourth logic gates 171_G2 to 171_G4 included in the request signal delay component 171 and eleventh to eighteenth logic gates 173_G11 to 173_G18 included in the write/read pointer generator 173 may be a basic digital logic gate which performs a logical AND operation.

In an embodiment, the request signal delay component 171 may include a first flip-flop 171_D1 corresponding to the first microcontroller of FIG. 4 (e.g., 150_1 of FIG. 4), a second flip-flop 171_D2 and a second logic gate 171_G2 corresponding to the second microcontroller of FIG. 4 (e.g., 150_2 of FIG. 4), a third flip-flop 171_D3 and a third logic gate 171_G3 corresponding to the third microcontroller of FIG. 4 (e.g., 150_3 of FIG. 4), and a fourth flip-flop 171_D4 and a fourth logic gate 171_G4 corresponding to the fourth microcontroller of FIG. 4 (e.g., 150_4 of FIG. 4).

In an embodiment, inverted masking signals may be input to the second to fourth logic gates 171_G2 to 171_G4. Also, an output terminal of the second logic gate 171_G2 may be coupled to an input terminal of the second flip-flop 171_D2, an output terminal of the third logic gate 171_G3 may be coupled to an input terminal of the third flip-flop 171_D3, and an output terminal of the fourth logic gate 171_G4 may be coupled to an input terminal of the fourth flip-flop 171_D4.

In an embodiment, because a masking signal corresponding to the first microcontroller (e.g., 150_1 of FIG. 4) is not present, the request signal delay component 171 might not include a logic gate corresponding to the first microcontroller (e.g., 150_1 of FIG. 4).

In an embodiment, the request signal delay component 171 and the write/read pointer generator 173 may receive first to fourth request signals REQ_1 to REQ_4 from the first to fourth microcontrollers of FIG. 4 (e.g., 150_1 to 150_4 of FIG. 4). The first to fourth request signals REQ_1 to REQ_4 may be in a high state or a low state.

When the first to fourth request signals REQ_1 to REQ_4 are in a high state, they may be signals requesting the initiation of operations of the first to fourth microcontrollers (e.g., 150_1 to 150_4 of FIG. 4), respectively, whereas when the first to fourth request signals REQ_1 to REQ_4 are in a low state, they may be signals requesting the termination of the operations of the first to fourth microcontrollers (e.g., 150_1 to 150_4 of FIG. 4), respectively.

First, when the first to fourth request signals REQ_1 to REQ_4 are received, the request signal delay component 171 may output first to fourth delayed request signals DREQ_1 to DREQ_4 obtained by delaying the first to fourth request signals REQ_1 to REQ_4. Here, the request signal delay component 171 may output the delayed request signals based on masking signals, as well as the first to fourth request signals REQ_1 to REQ_4.

For example, the first request signal REQ_1 output from the first microcontroller (e.g., 150_1 of FIG. 4) may be input to the first flip-flop 171_D1, and the first flip-flop 171_D1 may output the first delayed request signal DREQ_1 obtained by delaying the first request signal REQ_1. Because the first microcontroller (e.g., 150_1 of FIG. 4) performs an operation prior to other microcontrollers, a masking signal corresponding to the first microcontroller (e.g., 150_1 of FIG. 4) might not be present.

Also, an inverted signal of the second masking signal MASKING_SIG_2, together with the second request signal REQ_2 output from the second microcontroller (e.g., 150_2 of FIG. 4), may be input to the second logic gate 171_G2. Thereafter, a signal obtained by performing a logical AND operation on the second request signal REQ_2 and the inverted signal of the second masking signal MASKING_SIG_2 may be output from the second logic gate 171_G2, and the signal output from the second logic gate 171_G2 may be input to the second flip-flop 171_D2. The second flip-flop 171_D2 may output the second delayed request signal DREQ_2 obtained by delaying the second request signal REQ_2.

Further, an inverted signal of the third masking signal MASKING_SIG_3, together with the third request signal REQ_3 output from the third microcontroller (e.g., 150_3 of FIG. 4), may be input to the third logic gate 171_G3. Thereafter, a signal obtained by performing a logical AND operation on the third request signal REQ_3 and the inverted signal of the third masking signal MASKING_SIG_3 may be output from the third logic gate 171_G3, and the signal output from the third logic gate 171_G3 may be input to the third flip-flop 171_D3. The third flip-flop 171_D3 may output the third delayed request signal DREQ_3 obtained by delaying the third request signal REQ_3.

An inverted signal of the fourth masking signal MASKING_SIG_4, together with the fourth request signal REQ_4 output from the fourth microcontroller (e.g., 150_4 of FIG. 4), may be input to the fourth logic gate 171_G4. Thereafter, a signal obtained by performing a logical AND operation on the fourth request signal REQ_4 and the inverted signal of the fourth masking signal MASKING_SIG_4 may be output from the fourth logic gate 171_G4, and the signal output from the fourth logic gate 171_G4 may be input to the fourth flip-flop 171_D4. The fourth flip-flop 171_D4 may output the fourth delayed request signal DREQ_4 obtained by delaying the fourth request signal REQ_4.

In an embodiment, the second to fourth masking signals MASKING_SIG_2 to MASKING_SIG_4 may be in a high state or a low state. The second to fourth masking signals MASKING_SIG_2 to MASKING_SIG_4 may be used to determine the priority between the operations of the microcontrollers. Also, the second to fourth masking signals MASKING_SIG_2 to MASKING_SIG_4 may be determined depending on write pointers WT_POINTER_1 to WT_POINTER_4 output from the write/read pointer generator 173.

For example, when the second microcontroller (e.g., 150_2 of FIG. 4) is determined to perform an operation, the second masking signal MASKING_SIG_2 corresponding to the second microcontroller (e.g., 150_2 of FIG. 4) may change from a high state to a low state. That is, when the masking signal is in a high state, the signal output from the corresponding logic gate is in a low state, and thus a delayed request signal in a high state might not be output.

Therefore, when the masking signal is continuously maintained in a high state, the microcontroller corresponding to the masking signal cannot initiate an operation.

The second to fourth masking signals MASKING_SIG_2 to MASKING_SIG_4 will be described later with reference to FIG. 7.

In an embodiment, the write/read pointer generator 173 may include eleventh and twelfth logic gates 173_G11 and 173_G12 corresponding to the first microcontroller of FIG. 4 (e.g., 150_1 of FIG. 4), thirteenth and fourteenth logic gates 173_G13 and 173_G14 corresponding to the second microcontroller of FIG. 4 (e.g., 150_2 of FIG. 4), fifteenth and sixteenth logic gates 173_G15 and 173_G16 corresponding to the third microcontroller of FIG. 4 (e.g., 150_3 of FIG. 4), and seventeenth and eighteenth logic gates 173_G17 and 173_G18 corresponding to the fourth microcontroller of FIG. 4 (e.g., 150_4 of FIG. 4).

In an embodiment, the first request signal REQ_1 and an inverted signal of the first delayed request signal DREQ_1 may be input to the eleventh logic gate 173_G11 corresponding to the first microcontroller of FIG. 4 (e.g., 150_1 of FIG. 4). Further, the first delayed request signal DREQ_1 and an inverted signal of the first request signal REQ_1 may be input to the twelfth logic gate 173_G12 corresponding to the first microcontroller of FIG. 4 (e.g., 150_1 of FIG. 4). That is, inverted signals respectively input to the eleventh and twelfth logic gates 173_G11 and 173_G12 may differ from each other.

The request signals and delayed request signals, obtained by delaying the request signals, may also be input to the logic gates 173_G13 to 173_G18, respectively corresponding to the second to fourth microcontrollers (e.g., 150_2 to 150_4 of FIG. 4), other than the first microcontroller of FIG. 4 (e.g., 150_1 of FIG. 4).

For example, the second request signal REQ_2 and an inverted signal of the second delayed request signal DREQ_2 may be input to the thirteenth logic gate 173_G13. The second delayed request signal DREQ_2 and an inverted signal of the second request signal REQ_2 may be input to the fourteenth logic gate 173_G14. The third request signal REQ_3 and an inverted signal of the third delayed request signal DREQ_3 may be input to the fifteenth logic gate 173_G15. The third delayed request signal DREQ_3 and an inverted signal of the third request signal REQ_3 may be input to the sixteenth logic gate 173_G16. The fourth request signal REQ_4 and an inverted signal of the fourth delayed request signal DREQ_4 may be input to the seventeenth logic gate 173_G17. The fourth delayed request signal DREQ_4 and an inverted signal of the fourth request signal REQ_4 may be input to the eighteenth logic gate 173_G18.

In an embodiment, the first write pointer WT_POINTER_1 may be output from the eleventh logic gate 173_G11, the second write pointer WT_POINTER_2 may be output from the thirteenth logic gate 173_G13, the third write pointer WT_POINTER_3 may be output from the fifteenth logic gate 173_G15, and the fourth write pointer WT_POINTER_4 may be output from the seventeenth logic gate 173_G17.

Further, a first read pointer RD_POINTER_1 may be output from the twelfth logic gate 173_G12, a second read pointer RD_POINTER_2 may be output from the fourteenth logic gate 173_G14, a third read pointer RD_POINTER_3 may be output from the sixteenth logic gate 173_G16, and a fourth read pointer RD_POINTER_4 may be output from the eighteenth logic gate 173_G18.

In an embodiment, when each of the first to fourth write pointers WT_POINTER_1 to WT_POINTER_4 changes from a high state to a low state, a bit corresponding to each write pointer may be stored in a FIFO register (e.g., 175 of FIG. 5). Furthermore, the data stored in the FIFO register (e.g., 175 of FIG. 5) may be output in response to the write enable signal (e.g., WT_EN of FIG. 5) determined by the first to fourth write pointers WT_POINTER_1 to WT_POINTER_4.

In an embodiment, when the first to fourth read pointers RD_POINTER_1 to RD_POINTER_4 change from a high state to a low state, the states of response signals output from the first to fourth microcontrollers (e.g., 150_1 to 150_4 of FIG. 4) may be determined. In response to the response signals, the first to fourth microcontrollers (e.g., 150_1 to 150_4 of FIG. 4) may initiate or terminate the corresponding operations.

FIG. 7 is a diagram for explaining masking signals input to the request signal delay component of FIG. 5.

Referring to FIG. 7, second to fourth masking signals MASKING_SIG_2 to MASKING_SIG_4 that are input to the request signal delay component of FIG. 6 (e.g., 171 of FIG. 6) are depicted in time sequence. The second masking signal MASKING_SIG_2 may be inverted and input to the second logic gate of FIG. 6 (e.g., 171_G2 of FIG. 6), the third masking signal MASKING_SIG_3 may be inverted and input to the third logic gate of FIG. 6 (e.g., 171_G3 of FIG. 6), and the fourth masking signal MASKING_SIG_4 may be inverted and input to the fourth logic gate of FIG. 6 (e.g., 171_G4 of FIG. 6).

In FIG. 7, it is assumed that the request signal delay component (e.g., 171 of FIG. 6) sequentially receives request signals ranging from the first request signal REQ_1 corresponding to the first microcontroller (e.g., 150_1 of FIG. 4) to the fourth request signal REQ_4 corresponding to the fourth microcontroller (e.g., 150_4 of FIG. 4). Also, it is assumed that the plurality of microcontrollers are operated in the sequence of the first microcontroller (e.g., 150_1 of FIG. 4), the second microcontroller (e.g., 150_2 of FIG. 4), the third microcontroller (e.g., 150_3 of FIG. 4), and the fourth microcontroller (e.g., 150_4 of FIG. 4).

In an embodiment, the request signal delay component (e.g., 171 of FIG. 6) may receive the first request signal REQ_1 corresponding to the first microcontroller (e.g., 150_1 of FIG. 4). Here, the first request signal REQ_1 may be in a high state. The first request signal REQ_1 in a high state may be delayed and output through the first flip-flip (e.g., 171_D1 of FIG. 6).

When the first request signal REQ_1 in a high state is received, the request signal delay component 171 may generate a masking signal so that the first microcontroller (e.g., 150_1 of FIG. 4) is preferentially operated. For example, referring to a first column of FIG. 7, in order for the first microcontroller (e.g., 150_1 of FIG. 4) to be preferentially operated, each of the second to fourth masking signals MASKING_SIG_2 to MASKING_SIG_4, respectively input to the second to fourth logic gates (e.g., 171_G2 to 171_G4 of FIG. 6), may be set to a high state (1).

Referring to FIG. 6, when the second to fourth masking signals MASKING_SIG_2 to MASKING_SIG_4 in a high state are inverted and changed to a low state, and low-state masking signals are input to the second to fourth logic gates (e.g., 171_G2 to 171_G4 of FIG. 6), low-state signals may be input to the second to fourth flip-flops (e.g., 171_D2 to 171_D4 of FIG. 6) through respective logical AND operations. Therefore, delayed request signals in a low state may be output from the second to fourth flip-flops (e.g., 171_D2 to 171_D4 of FIG. 6).

As a result, in order for the first microcontroller (e.g., 150_1 of FIG. 4) to be preferentially operated, each of the second to fourth masking signals MASKING_SIG_2 to MASKING_SIG_4 may be set to a high state (1).

Thereafter, the request signal delay component (e.g., 171 of FIG. 6) may receive the second request signal REQ_2 corresponding to the second microcontroller (e.g., 150_2 of FIG. 4). Here, the second request signal REQ_2 may be in a high state. The second request signal REQ_2 in a high state may be delayed and output through the second flip-flip (e.g., 171_D2 of FIG. 6).

In an embodiment, the request signal delay component (e.g., 171 of FIG. 6) may receive the second request signal REQ_2 in a high state, together with the first request signal REQ_1 in a high state or an additional signal, or may receive only the second request signal REQ_2 in a high state. Therefore, in order to determine the priority between the operations of the microcontrollers, the second masking signal MASKING_SIG_2 corresponding to the second request signal REQ_2 may be set with reference to a write pointer.

For example, when the request signal delay component (e.g., 171 of FIG. 6) receives the second request signal REQ_2 in a high state, the state of the second masking signal MASKING_SIG_2 may be determined depending on the first write pointer WT_POINTER_1. That is, with reference to the first write pointer WT_POINTER_1 corresponding to the first microcontroller (e.g., 150_1 of FIG. 4) on which an operation is to be performed prior to the second microcontroller (e.g., 150_2 of FIG. 4) corresponding to the second request signal REQ_2, the state of the second masking signal MASKING_SIG_2 may be determined.

When the third request signal REQ_3 in a high state is received, the state of the third masking signal MASKING_SIG_3 may be determined with reference to the first write pointer WT_POINTER_1 corresponding to the first microcontroller (e.g., 150_1 of FIG. 4) and the second write pointer WT_POINTER_2 corresponding to the second microcontroller (e.g., 150_2 of FIG. 4). Further, when the fourth request signal REQ_4 in a high state is received, the state of the fourth masking signal MASKING_SIG_4 may be determined with reference to the first write pointer WT_POINTER_1 corresponding to the first microcontroller (e.g., 150_1 of FIG. 4), the second write pointer WT_POINTER_2 corresponding to the second microcontroller (e.g., 150_2 of FIG. 4), and the third write pointer WT_POINTER_3 corresponding to the third microcontroller (e.g., 150_3 of FIG. 4).

In an embodiment, when the request signal delay component (e.g., 171 of FIG. 6) receives the second request signal REQ_2 in a high state, the first write pointer WT_POINTER_1 may be referred to. Referring to a second column in FIG. 7, when the first write pointer WT_POINTER_1 is in a low state, the second masking signal MASKING_SIG_2 in a low state may be input to the second logic gate (e.g., 171_G2 of FIG. 6). However, when the first write pointer WT_POINTER_1 is in a high state, the second masking signal MASKING_SIG_2 in a low state may be input to the second logic gate (e.g., 171_G2 of FIG. 6) after the first write pointer WT_POINTER_1 has changed to a low state. In this case, because the third and fourth microcontrollers (e.g., 150_3 and 150_4 of FIG. 4) are not operated, the third and fourth masking signals MASKING_SIG_3 and MASKING_SIG_4 may be in a high state.

Thereafter, the request signal delay component (e.g., 171 of FIG. 6) may receive the third request signal REQ_3 in a high state. When the third request signal REQ_3 in a high state is received, the first and second write pointers WT_POINTER_1 and WT_POINTER_2 may be referred to. Referring to a third column in FIG. 7, when both the first and second write pointers WT_POINTER_1 and WT_POINTER_2 are in a low state, the third masking signal MASKING_SIG_3 in a low state may be input to the third logic gate (e.g., 171_G3 of FIG. 6). Here, because the second masking signal MASKING_SIG_2 has changed to a low state, the changed state may be maintained.

However, when at least one of the first and second write pointers WT_POINTER_1 and WT_POINTER_2 is in a high state, the third masking signal MASKING_SIG_3 in a low state may be input to the third logic gate (e.g., 171_G3 of FIG. 6) after all of the corresponding write pointers in the high state have changed to a low state. At this time, because the fourth microcontroller (e.g., 150_4 of FIG. 4) is not operated, the fourth masking signal MASKING_SIG_4 may be in a high state.

Figure 8:
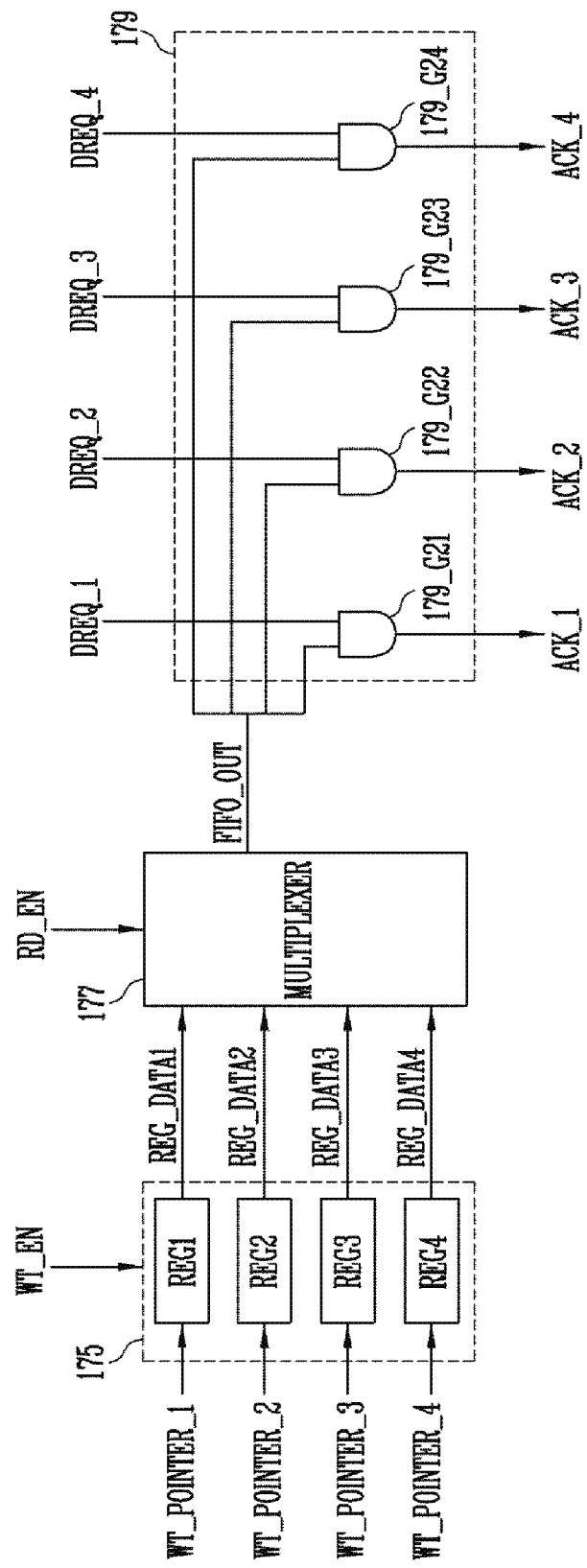
FIG. 8 is a diagram illustrating a first in first out (FIFO) register, a multiplexer, and a response signal generator of FIG. 5.

FIG. 8 is a diagram illustrating the FIFO register, the multiplexer, and the response signal generator of FIG. 5.

Referring to FIG. 8, the FIFO register 175, the multiplexer 177, and the response signal generator 179, among the components included in the priority determination circuit of FIG. 5, are illustrated in FIG. 8. The FIFO register 175 may include first to fourth registers REG1 to REG4, and the response signal generator 179 may include 21-st to 24-th logic gates 179_G21 to 179_G24.

In an embodiment, the FIFO register 175 may receive the first to fourth write pointers WT_POINTER_1 to WT_POINTER_4 and the write enable signal WT_EN generated based on the first to fourth write pointers WT_POINTER_1 to WT_POINTER_4 from the write/read pointer generator (e.g., 173 of FIG. 6). The FIFO register 175 may store data in the first to fourth registers REG1 to REG4 based on the received first to fourth write pointers WT_POINTER_1 to WT_POINTER_4, and may output any one of pieces of data stored in the first to fourth registers REG1 to REG4 in response to the write enable signal WT_EN. A logical data value stored in the first to fourth registers REG1 to REG4, as an initial default value, may be '0000'.

For example, the FIFO register 175 may store logical data so that, when the first write pointer WT_POINTER_1 in a high state is received, logical data '0001' is stored in the first register REG1, when the second write pointer WT_POINTER_2 in a high state is received, logical data '0010' is stored in the second register REG2, when the third write pointer WT_POINTER_3 in a high state is received, logical data '0100' is stored in the third register REG3, and when the fourth write pointer WT_POINTER_4 in a high state is received, logical data '1000' is stored in the fourth register REG4.

In an embodiment, the FIFO register 175 may store the pieces of data in the sequence of received write pointers. For example, when the third write pointer WT_POINTER_3 in a high state is received after the first write pointer WT_POINTER_1 in a high state has been received, logical data '0001' may be stored in the first register REG1, and logical data '0100' may be stored in the third register REG3.

When the data is stored in the FIFO register 175, the data may be output in response to the write enable signal WT_EN. In an embodiment, data output from the first register REG1 may be first register data REG_DATA1, data output from the second register REG2 may be second register data REG_DATA2, data output from the third register REG3 may be third register data REG_DATA3, and data output from the fourth register REG4 may be fourth register data REG_DATA4.

In an embodiment, the write enable signal WT_EN may be logical data '00' as a default value. Thereafter, whenever any one of the first to fourth write pointers WT_POINTER_1 to WT_POINTER_4 in a high state is received, the write enable signal WT_EN may have a data value which changes from '00' to '01', from '01' to '10', and from '10' to '11'. The FIFO register 175 may sequentially output pieces of data stored in the registers from the first register REG1 to the fourth register REG4 whenever the changed write enable signal WT_EN is received.

For example, when the FIFO register 175 receives the write enable signal WT_EN having a data value changing from '00' to '01', the FIFO register 175 may output the first register data REG_DATA1 stored in the first register REG1. Next, when the FIFO register 175 receives the write enable signal WT_EN having a data value changing from '01' to '10', the FIFO register 175 may output the second register data REG_DATA2 stored in the second register REG2.

Thereafter, when the FIFO register 175 receives the write enable signal WT_EN having a data value changing from '10' to '11', the FIFO register 175 may output the third register data REG_DATA3 stored in the third register REG3. Furthermore, when the FIFO register 175 receives the write enable signal WT_EN having a data value changing from '11' to '00', the FIFO register 175 may output the fourth register data REG_DATA4 stored in the fourth register REG4.

In an embodiment, when all of pieces of data stored in the first to fourth registers REG1 to REG4 are output, the FIFO register 175 may be reset. When the FIFO register 175 is reset, the FIFO register 175 may receive the first to fourth write pointers WT_POINTER_1 to WT_POINTER_4, and may store new data based on the received write pointers. Thereafter, the FIFO register 175 may sequentially output pieces of data stored in the registers from the first register REG1 to the fourth register REG4 whenever the changed write enable signal WT_EN is received.

In an embodiment, the multiplexer 177 may receive any one of the pieces of first to fourth register data REG_DATA1 to REG_DATA4 output from the first to fourth registers REG1 to REG4 and a read enable signal RD_EN. The read enable signal RD_EN may be generated based on first to fourth read pointers RD_POINTER_1 to RD_POINTER_4. The multiplexer 177 may output the first to fourth register data REG_DATA1 to REG_DATA4, as FIFO data FIFO_OUT, to the response signal generator 179 in response to the read enable signal RD_EN.

In an embodiment, the read enable signal RD_EN may be logical data '00' as a default value. Thereafter, whenever any one of the first to fourth read pointers RD_POINTER_1 to RD_POINTER_4 in a high state is received, the read enable signal RD_EN may have a data value which changes from '00' to '01', from '01' to '10', and from '10' to '11'. Whenever the changed read enable signal RD_EN is received, the multiplexer 177 may output the register data received from the FIFO register 175 as the FIFO data FIFO_OUT. When register data is first received from the FIFO register 175, the multiplexer 177 may output the received register data as the FIFO data FIFO_OUT regardless of whether the read enable signal RD_EN has changed.

For example, when the first register data REG_DATA1 is first received from the FIFO register 175, the multiplexer 177 may output the first register data REG_DATA1, that is, logical data '0001' as the FIFO data FIFO_OUT, regardless of whether the read enable signal RD_EN has changed. Thereafter, until the read enable signal RD_EN having a changed data value is received, the multiplexer 177 may output the logical data '0001', which is the first register data REG_DATA1 that has been previously output, as the FIFO data FIFO_OUT, regardless of the data received from the FIFO register 175.

When the read enable signal RD_EN having a data value changing from '00' to '01' is received, the multiplexer 177 may output logical data '0010', which is the second register data REG_DATA2 received from the FIFO register 175, as the FIFO data FIFO_OUT. As described above, until the read enable signal RD_EN having a changed data value is received, the multiplexer 177 may output the logical data '0010', which is the second register data REG_DATA2 that has been previously output, as the FIFO data FIFO_OUT, regardless of the data received from the FIFO register 175.

Next, when the read enable signal RD_EN having a data value changing from '01' to '10' is received, the multiplexer 177 may output logical data '0100', which is the third register data REG_DATA3 received from the FIFO register 175, as the FIFO data FIFO_OUT. Even in this case, until the read enable signal RD_EN having a changed data value is received, the multiplexer 177 may output the logical data '0100', which is the third register data REG_DATA3 that has been previously output, as the FIFO data FIFO_OUT, regardless of the data received from the FIFO register 175.

Thereafter, when the read enable signal RD_EN having a data value changing from '10' to '11' is received, the multiplexer 177 may output logical data '1000', which is the fourth register data REG_DATA4 received from the FIFO register 175, as the FIFO data FIFO_OUT. Even in this case, until the read enable signal RD_EN having a changed data value is received, the multiplexer 177 may output the logical data '1000', which is the fourth register data REG_DATA4 that has been previously output, as the FIFO data FIFO_OUT, regardless of the data received from the FIFO register 175.

In an embodiment, the FIFO data FIFO_OUT output from the multiplexer 177 may be input to the 21-st to 24-th logic gates 179_G21 to 179_G24 included in the response signal generator 179.

For example, when the FIFO data FIFO_OUT is '0001', a signal in a low state (0) may be input to the 21-st to 23-rd logic gates 179_G21 to 179_G23, and a signal in a high state (1) signal may be input to the 24-th logic gate 179_G24. When the FIFO data FIFO_OUT is '0010', a signal in a low state (0) may be input to the 21-st, 22-nd, and 24-th logic gates 179_G21, 179_G22, and 179_G24, and a signal in a high state (1) may be input to the 23-rd logic gate 179_G23.

The response signal generator 179 may receive not only the FIFO data FIF0_OUT but also first to fourth delayed request signals DREQ_1 to DREQ_4 from the request signal delay component of FIG. 6 (e.g., 171 of FIG. 6). In an embodiment, the first to fourth delayed request signals DREQ_1 to DREQ_4 may be input to the 21-st to 24-th logic gates 179_G21 to 179_G24, respectively.

In an embodiment, when the FIFO data FIFO_OUT and the first to fourth delayed request signals DREQ_1 to DREQ_4 are input to the response signal generator 179, first to fourth response signals ACK_1 to ACK_4, each being generated by performing a logical AND operation, may be output from the 21-st to 24-th logic gates 179_G21 to 179_G24, respectively.

In an embodiment, when the FIFO data FIFO_OUT and the first to fourth delayed request signals DREQ_1 to DREQ_4 are input to the response signal generator 179, first to fourth response signals ACK_1 to ACK_4, each being generated by performing a logical AND operation, may be output from the 21-st to 24-th logic gates 179_G21 to 179_24, respectively.

For example, the first response signal ACK_1, generated by performing a logical AND operation on the FIFO data FIFO_OUT and the first delayed request signal DREQ_1, may be output from the 21-st logic gate 179_G21. The second response signal ACK_2, generated by performing a logical AND operation on the FIFO data FIFO_OUT and the second delayed request signal DREQ_2, may be output from the 22-nd logic gate 179_G22. The third response signal ACK_3, generated by performing a logical AND operation on the FIFO data FIFO_OUT and the third delayed request signal DREQ_3, may be output from the 23-rd logic gate 179_G23. The fourth response signal ACK_4, generated by performing a logical AND operation on the FIFO data FIFO_OUT and the fourth delayed request signal DREQ_4, may be output from the 24-th logic gate 179_G24.

The first to fourth response signals ACK_1 to ACK_4 may be output from the response signal generator 179, and may be provided to the first to fourth microcontrollers (e.g., 150_1 to 150_4 of FIG. 4). The first to fourth microcontrollers (e.g., 150_1 to 150_4 of FIG. 4) may initiate or terminate operations depending on whether the first to fourth response signals ACK_1 to ACK_4 are in a high state or a low state.

A method by which the first to fourth microcontrollers (e.g., 150_1 to 150_4 of FIG. 4) initiate or terminate operations depending on the first to fourth response signals ACK_1 to ACK_4 will be described below with reference to FIG. 9.

Figure 9:
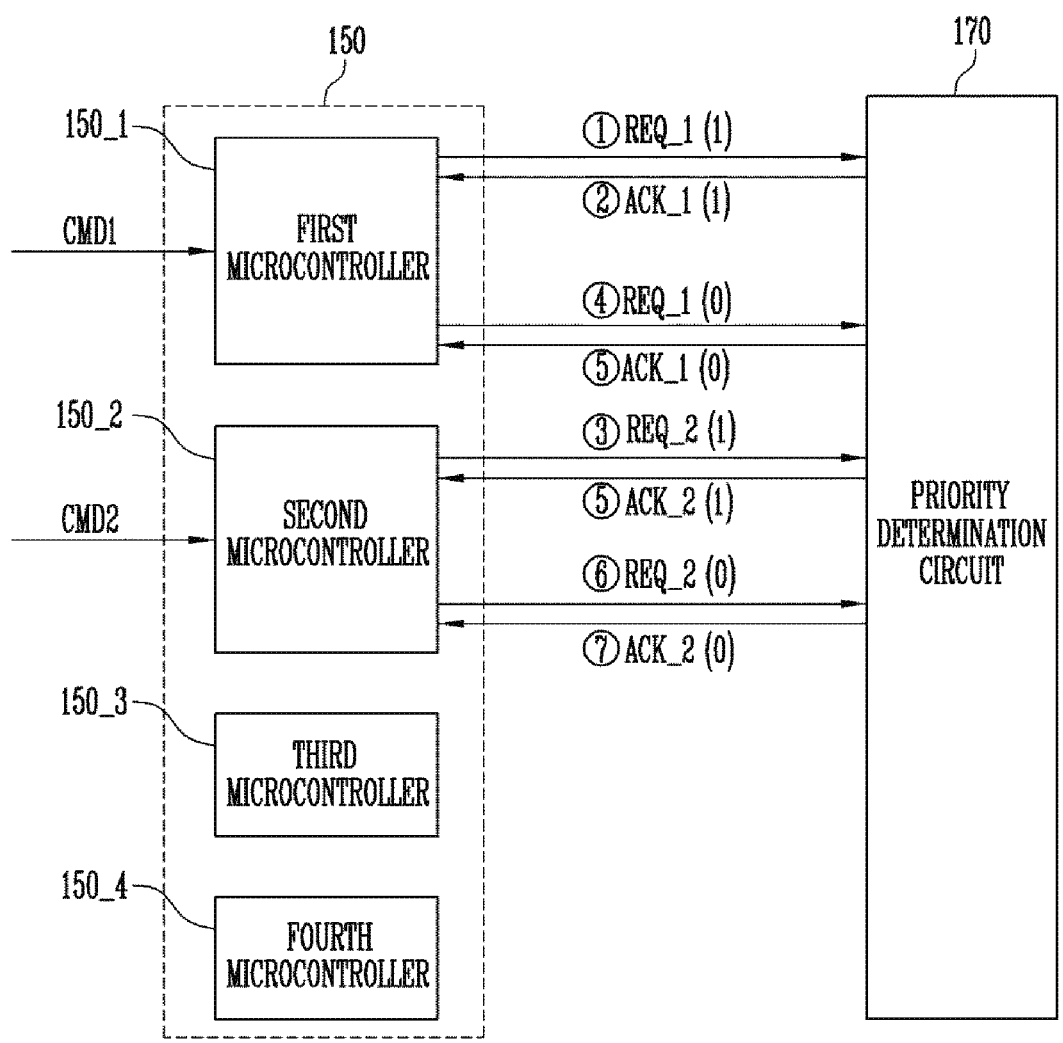
FIG. 9 is a diagram for explaining responses output from the priority determination circuit when requests are received from a plurality of microcontrollers at different time points.

FIG. 9 is a diagram for explaining responses output from the priority determination circuit when requests are received from a plurality of microcontrollers at different time points.

Referring to FIG. 9, a microcontroller circuit 150 and a priority determination circuit 170 are illustrated in FIG. 9. The microcontroller circuit 150 may include first to fourth microcontrollers 150_1 to 150_4. In FIG. 9, it is assumed that the priority of operation is determined in the sequence of the first microcontroller 150_1, the second microcontroller 150_2, the third microcontroller 150_3, and the fourth microcontroller 150_4. In other embodiments, the priority of operation may be determined in another sequence.

In an embodiment, the microcontroller circuit 150 may receive a command from an external device. The command received from the external device may be a command for instructing an operation to be performed on at least one of first to fourth planes PLANE1 to PLANE4 of FIG. 4.

In FIG. 9, it is assumed that first and second commands CMD1 and CMD2, received from the external device, are commands for instructing operations to be performed on the first and second planes PLANE1 and PLANE2 of FIG. 4. Therefore, the first command CMD1 received from the external device may be provided to the first microcontroller 150_1 which controls an operation to be performed on the first plane PLANE1, and the second command CMD2 may be provided to the second microcontroller 150_2 which controls an operation to be performed on the second plane PLANE2.

In an embodiment, the microcontroller circuit 150 may first receive the first command CMD1 from the external device. That is, the microcontroller circuit 150 may first receive the command for instructing an operation to be performed on the first plane PLANE1. The first command CMD1 may be provided to the first microcontroller 150_1 corresponding to the first plane PLANE1. The first microcontroller 150_1 may output a first request signal REQ_1 in a high state (1) in response to the first command CMD1 (①).

Because the microcontroller circuit 150 does not receive any other command before receiving the first command CMD1 and the first microcontroller 150_1 is determined to be operated first (with the highest priority), the priority determination circuit 170 may determine the first microcontroller 150_1 to preferentially perform an operation. Therefore, the priority determination circuit 170 may output a first response signal ACK_1 in a high state (1) so that the first microcontroller 150_1 preferentially performs an operation (②). The first response signal ACK_1 in a high state may be a signal for instructing the first microcontroller 150_1 to initiate the operation.

In an embodiment, when the first microcontroller 150_1 receives the first response signal ACK_1 in a high state (1) from the priority determination circuit 170, the first microcontroller 150_1 may control the first plane PLANE1 so that an operation corresponding to the first command CMD1 is performed on the first plane PLANE1. That is, the first microcontroller 150_1 may initiate the operation in response to the first response signal ACK_1.

In an embodiment, while the first microcontroller 150_1 performs an operation, the microcontroller circuit 150 may receive a second command CMD2 from the external device. That is, while the first microcontroller 150_1 performs an operation, the microcontroller circuit 150 may receive a command for instructing an operation to be performed on the second plane PLANE2. The second command CMD2 may be provided to the second microcontroller 150_2 corresponding to the second plane PLANE2. The second microcontroller 150_2 may output a second request signal REQ_2 in a high state (1) in response to the second command CMD2 (③).

Because the first microcontroller 150_1 is in operation at a time point at which the second microcontroller 150_2 receives the second command CMD2, and there is no command received together with the second command CMD2, the priority determination circuit 170 might not determine the priority of operation. That is, the priority determination circuit 170 may control the microcontrollers so that the second microcontroller 150_2 performs an operation immediately after the first microcontroller 150_1 has terminated the operation thereof.

In an embodiment, because the second request signal REQ_2 in a high state (1) is received from the second microcontroller 150_2 during the operation of the first microcontroller 150_1, the priority determination circuit 170 might not output a second response signal ACK_2 in a high state (1) to the second microcontroller 150_2 until the first request signal REQ_1 in a low state (0) is received from the first microcontroller 150_1. The first request signal REQ_1 in a low state (0) may be a signal indicating the completion of the operation of the first microcontroller 150_1, and the second response signal ACK_2 in a high state (1) may be a signal for instructing the second microcontroller 150_2 to initiate an operation.

In an embodiment, after a predetermined period of time has elapsed because the priority determination circuit 170 received the second request signal REQ_2 in a high state (1) from the second microcontroller 150_2, the first microcontroller 150_1 may complete all of the operation corresponding to the first command CMD1. When the first microcontroller 150_1 completes the operation, the first microcontroller 150_1 may output the first request signal REQ_1 in a low state (0) indicating the completion of the operation to the priority determination circuit 170 (④). The priority determination circuit 170 may output the first response signal ACK_1 in a low state (0) in response to the first request signal REQ_1 in a low state (0) (⑤).

Here, the priority determination circuit 170 may output the second response signal ACK_2 in a high state (1), together with the first response signal ACK_1 in a low state (0) (⑤). That is, because the operation of the first microcontroller 150_1 has been completed, the priority determination circuit 170 may output the second response signal ACK_2 in a high state (1) for initiating the operation of the second microcontroller 150_2, together with the first response signal ACK_1 in a low state (0) for terminating the operation of the first microcontroller 150_1. The first response signal ACK_1 in a low state (0) may be provided to the first microcontroller 150_1, and the second response signal ACK_2 in a high state (1) may be provided to the second microcontroller 150_2.

In an embodiment, when the first response signal ACK_1 in a low state (0) is provided to the first microcontroller 150_1, the first microcontroller 150_1 may terminate the operation. Also, when the second response signal ACK_2 in a high state (1) is provided to the second microcontroller 150_2, the second microcontroller 150_2 may initiate an operation.

Thereafter, the second microcontroller 150_2 may complete all of the operation corresponding to the second command CMD2. When the second microcontroller 150_2 completes the operation, the second microcontroller 150_2 may output the second request signal REQ_2 in a low state (0) indicating the completion of the operation to the priority determination circuit 170 (⑥). The priority determination circuit 170 may output the second response signal ACK_2 in a low state (0) in response to the second request signal REQ_2 in a low state (0) (⑦). When the second response signal ACK_2 in a low state (0) is provided to the second microcontroller 150_2, the second microcontroller 150_2 may terminate the operation.

Figure 10:
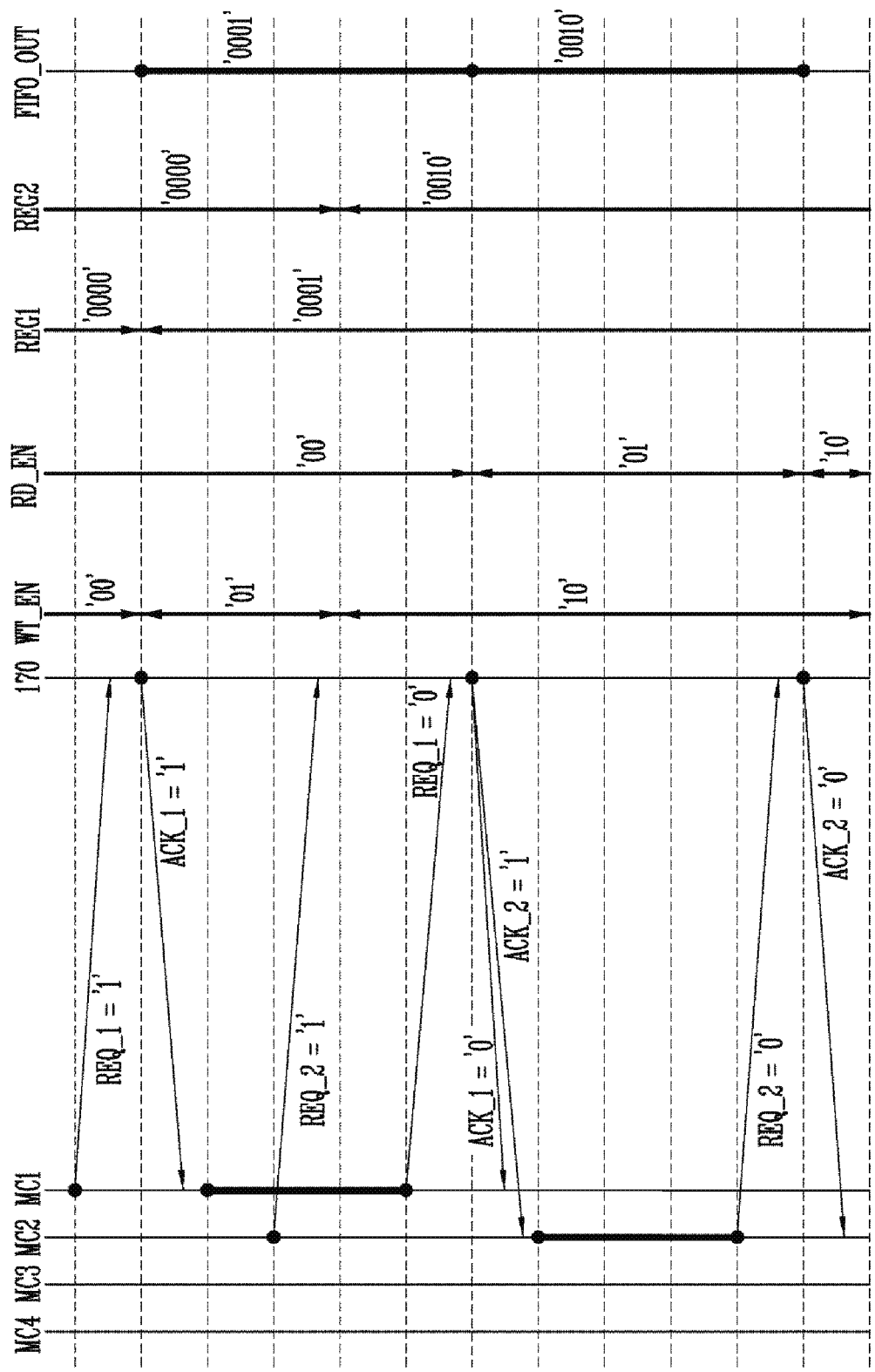
FIG. 10 is a diagram illustrating the operation of a microcontroller circuit and the priority determination circuit of FIG. 9.

FIG. 10 is a diagram illustrating the operation of the microcontroller circuit and the priority determination circuit of FIG. 9.

Referring to FIG. 10, request signals output from a first microcontroller MC1 (e.g., 150_1 of FIG. 9) and a second microcontroller MC2 (e.g., 150_2 of FIG. 9), included in the microcontroller circuit of FIG. 9 (e.g., 150 of FIG. 9), and response signals output from the priority determination circuit (e.g., 170 of FIG. 9) are illustrated in FIG. 10. MC3 may be the third microcontroller of FIG. 9 (e.g., 150_3 of FIG. 9), and MC4 may be the fourth microcontroller of FIG. 9 (e.g., 150_4 of FIG. 9).

As in the case of FIG. 9, in FIG. 10, it is assumed that a priority is determined in the sequence of the first microcontroller MC1, the second microcontroller MC2, the third microcontroller MC3, and the fourth microcontroller MC4.

Furthermore, FIG. 10 illustrates a write enable signal WT_EN and a read enable signal RD_EN which are generated in the priority determination circuit 170, data which is stored in first and second registers REG1 and REG2 included in the FIFO register of FIG. 8 (e.g., 175 of FIG. 8), and FIFO data FIFO_OUT which is output from the multiplexer of FIG. 8 (e.g., 177 of FIG. 8). In FIG. 10, default data values for the write enable signal WT_EN and the read enable signal RD_EN may be '00', and default data values initially stored in the first and second registers REG1 and REG2 may be '0000'.

In an embodiment, the first microcontroller MC1 may first receive a first command CMD1 from an external device, and may output a first request signal REQ_1 in a high state (1) in response to the first command CMD1 (REQ_1='1').

Because the command is first received from the external device and the first microcontroller MC1 is determined to preferentially perform an operation, the write enable signal WT_EN may change from a default data value of '00' to '01', and logical data '0001' may be stored in the first register REG1 when the first request signal in a high state (REQ_1='1') is received.

Also, because the changed write enable signal WT_EN is input to the FIFO register (e.g., 175 of FIG. 5), first register data REG_DATA1 stored in the first register REG1 may be output. Further, because the first register data REG_DATA1 and the read enable signal RD_EN are input to the multiplexer of FIG. 8 (e.g., 177 of FIG. 8) and the read enable signal RD_EN is a default data value of '00', the FIFO data FIFO_OUT may be '0001', which is the first register data REG_DATA1.

Therefore, based on the FIFO data FIFO_OUT, the first response signal ACK_1 in a high state (1), corresponding to the first request signal in a high state (REQ_1='1'), may be output from the priority determination circuit (e.g., 170 of FIG. 9), and may be provided to the first microcontroller MC1 (ACK_1='1'). When the first response signal in a high state (ACK_1='1') is received, the first microcontroller MC1 may initiate an operation.

Thereafter, while the first microcontroller MC1 performs an operation, the second microcontroller MC2 may receive a second command CMD2 from the external device, and may output a second request signal REQ_2 in a high state (1) to the priority determination circuit 170 in response to the second command CMD2 (REQ_2='1'). When the priority determination circuit 170 receives the first request signal in a high state (REQ_1='1'), the write enable signal WT_EN may change from '01' to '10', and logical data '0010' may be stored in the second register REG2, and may be output from the second register REG2.

Because the changed write enable signal WT_EN is input to the FIFO register (e.g., 175 of FIG. 5), second register data REG_DATA2 stored in the second register REG2 may be output. However, because the read enable signal RD_EN has a default data value of '00' other than a changed data value, the FIFO data FIFO_OUT may still be '0001', which is the first register data REG_DATA1.

Because the first microcontroller MC1 receives only a single command from the external device while performing the operation, the priority determination circuit 170 may omit the step of determining the priority between the operations of the microcontrollers. That is, the priority determination circuit 170 does not determine the priority, and may control the microcontrollers so that, when the first microcontroller MC1 completes the operation, the second microcontroller MC2 performs an operation.

In an embodiment, after a predetermined period of time has elapsed because the priority determination circuit 170 received the second request signal REQ_2 in a high state (1) from the second microcontroller MC2, the first microcontroller MC1 may complete all of the operation corresponding to the first command CMD1. When the first microcontroller MC1 completes the operation, the first microcontroller MC1 may output the first request signal REQ_1 in a low state (0) indicating the completion of the operation to the priority determination circuit 170 (REQ_1='0').

When the first request signal REQ_1 in a low state (0) is received, the priority determination circuit 170 may output the first response signal ACK_1 in a low state (0) to the first microcontroller MC1 (ACK_1='0'), and may output a second response signal ACK_2 in a high state (1) to the second microcontroller MC2 (ACK_2='1'). That is, the first response signal ACK_1 in a low state (0) and the second response signal ACK_2 in a high state (1) may be simultaneously output from the priority determination circuit 170. The reason for this is that the operation of the first microcontroller MC1 has been completed, and thus the priority determination circuit 170 may control the microcontrollers so that, at the same time that the operation of the first microcontroller MC1 is terminated, the operation of the second microcontroller MC2 is initiated. By means of the operation of the priority determination circuit 170, the operations of the microcontrollers may be sequentially performed without overlapping each other.

Also, when the first request signal REQ_1 in a low state (0) is received, the read enable signal RD_EN may change from a default data value of '00' to '01', and the changed read enable signal RD_EN may be input to the multiplexer of FIG. 8 (e.g., 177 of FIG. 8). However, because the read enable signal RD_EN has a value of '01' which is the changed data value, the FIFO data FIFO_OUT may be '0010', which is the second register data REG_DATA2.

Thereafter, the second microcontroller MC2 may complete all of the operation corresponding to the second command CMD2, and may output the second request signal REQ_2 in a low state (0) indicating the completion of the operation to the priority determination circuit 170 (REQ_2='0'). Also, when the priority determination circuit 170 receives the second request signal REQ_2 in a low state (0), the read enable signal RD_EN may change from '01' to '10', and may be input to the multiplexer of FIG. 8 (e.g., 177 of FIG. 8). However, because data is not yet stored in the third register REG3, the FIFO data FIFO_OUT may be '0010', which is the second register data REG_DATA2.

In an embodiment, the priority determination circuit 170 may output the second response signal ACK_2 in a low state (0) in response to the second request signal REQ_2 in a low state (0). When the second response signal ACK_2 in a low state (0) is provided to the second microcontroller MC2, the second microcontroller MC2 may terminate the operation.

Figure 11:
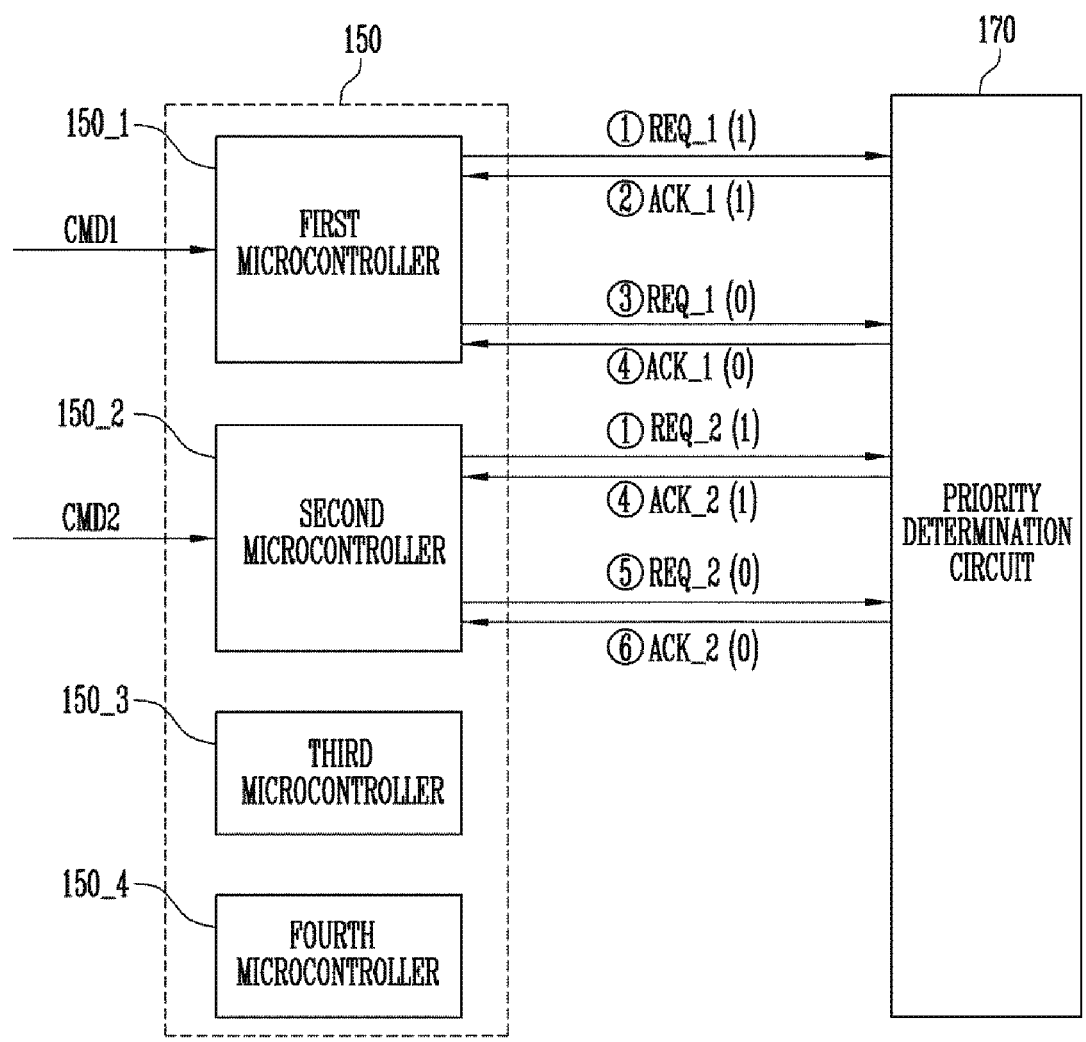
FIG. 11 is a diagram for explaining responses output from the priority determination circuit when requests are received from a plurality of microcontrollers at the same time point.

FIG. 11 is a diagram for explaining responses output from the priority determination circuit when requests are received from a plurality of microcontrollers at the same time point.

Referring to FIGS. 9 and 11, FIG. 11 illustrates a microcontroller circuit 150 and a priority determination circuit 170, similarly to FIG. 9. However, unlike FIG. 9, FIG. 11 illustrates a case where first and second commands CMD1 and CMD2 are received from an external device at the same time point.

In the same manner as FIG. 9, in FIG. 11, the microcontroller circuit 150 includes first to fourth microcontrollers 150_1 to 150_4, and the priority of operation may be determined in the sequence of the first microcontroller 150_1, the second microcontroller 150_2, the third microcontroller 150_3, and the fourth microcontroller 150_4.

In an embodiment, the microcontroller circuit 150 may receive a command from an external device. The command received from the external device may be a command for instructing an operation to be performed on at least one of first to fourth planes PLANE1 to PLANE4 of FIG. 4.

For example, the microcontroller circuit 150 may receive first and second commands CMD1 and CMD2 from the external device. The first command CMD1 may be a command for instructing an operation to be performed on the first plane PLANE1, and the second command CMD2 may be a command for instructing an operation to be performed on the second plane PLANE2. Therefore, the first command CMD1 received from the external device may be provided to the first microcontroller 150_1 which controls an operation to be performed on the first plane PLANE1, and the second command CMD2 received from the external device may be provided to the second microcontroller 150_2 which controls an operation to be performed on the second plane PLANE2.

In an embodiment, the microcontroller circuit 150 may simultaneously receive a plurality of commands for instructing operations to be performed on different planes from the external device. The plurality of commands received from the external device may be provided to microcontrollers respectively corresponding to different planes.

For example, when the commands simultaneously received from the external device are the first command CMD1 for instructing an operation to be performed on the first plane PLANE1 and the second command CMD2 for instructing an operation to be performed on the second plane PLANE2, the first command CMD may be provided to the first microcontroller 150_1 corresponding to the first plane PLANE1, and the second command CMD2 may be provided to the second microcontroller 150_2 corresponding to the second plane PLANE2.

In an embodiment, the first microcontroller 150_1 may output a first request signal REQ_1 in a high state (1) in response to the first command CMD1, and the second microcontroller 150_2 may output a second request signal REQ_2 in a high state (1) in response to the second command CMD2 (①).

Because the priority determination circuit 170 simultaneously receives the first request signal REQ_1 in a high state (1) and the second request signal REQ_2 in a high state (1), the priority determination circuit 170 may determine the priority between the first and second microcontrollers 150_1 and 150_2.

In an embodiment, because the first microcontroller 150_1 has been designated to be operated with the highest priority, the priority determination circuit 170 may determine that the first microcontroller 150_1 is to preferentially perform an operation. Therefore, the priority determination circuit 170 may output a first response signal ACK_1 in a high state (1) so that the first microcontroller 150_1 preferentially performs the operation (②), and might not output a second response signal ACK_2 in a high state (1). The first response signal ACK_1 in a high state may be a signal for instructing the first microcontroller 150_1 to initiate the operation.

In an embodiment, when the first microcontroller 150_1 receives the first response signal ACK_1 in a high state (1) from the priority determination circuit 170, the first microcontroller 150_1 may control the first plane PLANE1 so that an operation corresponding to the first command CMD1 is performed on the first plane PLANE1. That is, the first microcontroller 150_1 may initiate the operation in response to the first response signal ACK_1.

Thereafter, the first microcontroller 150_1 may complete all of the operation corresponding to the first command CMD1. When the first microcontroller 150_1 completes the operation, the first microcontroller 150_1 may output the first request signal REQ_1 in a low state (0) indicating the completion of the operation to the priority determination circuit 170 (③). The priority determination circuit 170 may output the first response signal ACK_1 in a low state (0) in response to the first request signal REQ_1 in a low state (0) (④).

Here, the priority determination circuit 170 may output the second response signal ACK_2 in a high state (1), together with the first response signal ACK_1 in a low state (0) (④). That is, because the operation of the first microcontroller 150_1 has been completed, the priority determination circuit 170 may output the second response signal ACK_2 in a high state (1) for initiating the operation of the second microcontroller 150_2, together with the first response signal ACK_1 in a low state (0) for terminating the operation of the first microcontroller 150_1. The first response signal ACK_1 in a low state (0) may be provided to the first microcontroller 150_1, and the second response signal ACK_2 in a high state (1) may be provided to the second microcontroller 150_2.

In an embodiment, when the first response signal ACK_1 in a low state (0) is provided to the first microcontroller 150_1, the first microcontroller 150_1 may terminate the operation. Also, when the second response signal ACK_2 in a high state (1) is provided to the second microcontroller 150_2, the second microcontroller 150_2 may initiate an operation.

Thereafter, the second microcontroller 150_2 may complete all of the operation corresponding to the second command CMD2. When the second microcontroller 150_2 completes the operation, the second microcontroller 150_2 may output the second request signal REQ_2 in a low state (0) indicating the completion of the operation to the priority determination circuit 170 (⑤). The priority determination circuit 170 may output the second response signal ACK_2 in a low state (0) in response to the second request signal REQ_2 in a low state (0) (⑥). When the second response signal ACK_2 in a low state (0) is provided to the second microcontroller 150_2, the second microcontroller 150_2 may terminate the operation.

Figure 12:
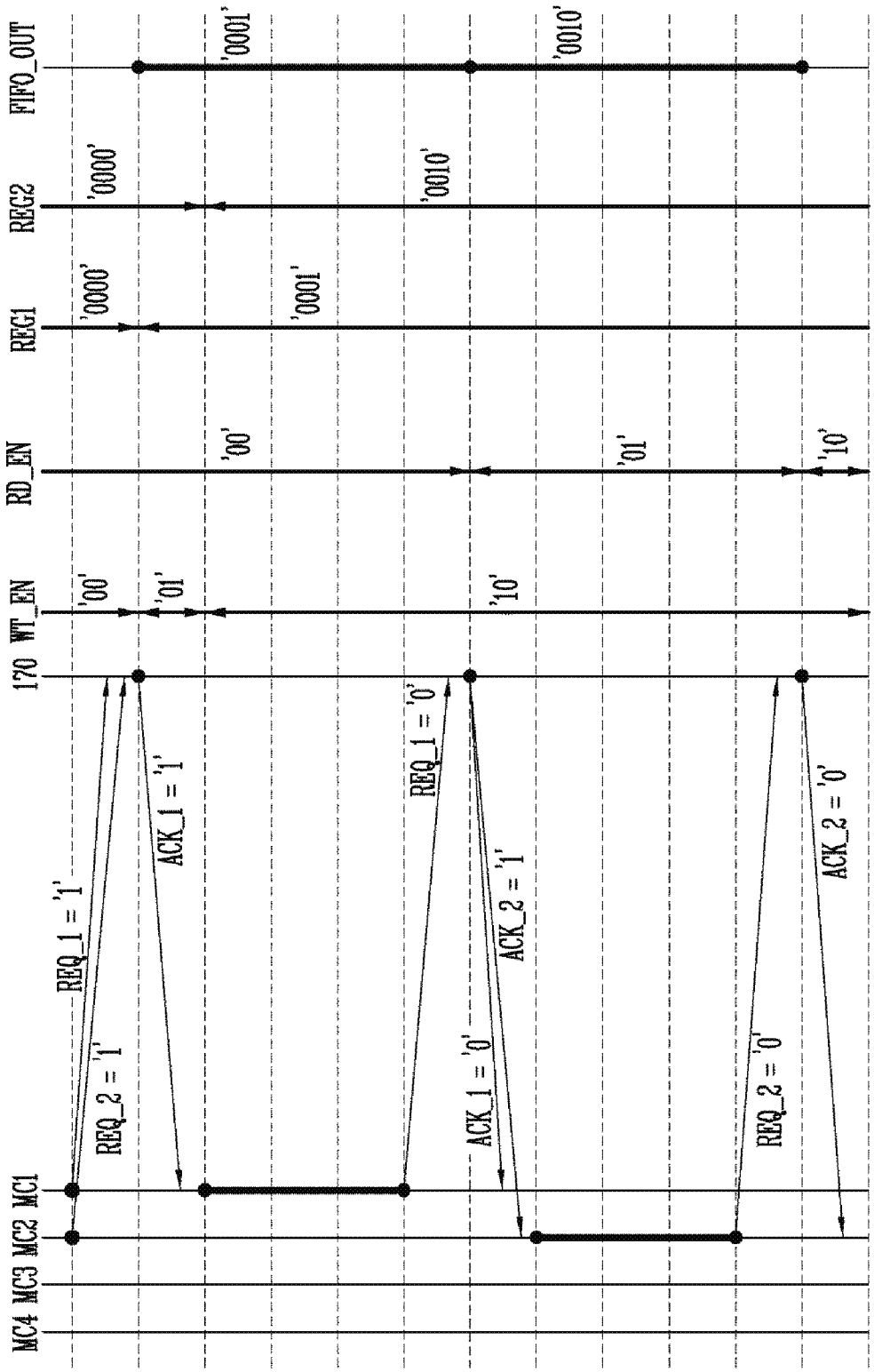
FIG. 12 is a diagram illustrating the operation of the microcontroller circuit and the priority determination circuit of FIG. 11.

FIG. 12 is a diagram illustrating the operation of the microcontroller circuit and the priority determination circuit of FIG. 11.

Referring to FIGS. 10 and 12, request signals output from a first microcontroller (e.g., 150_1 of FIG. 9) MC1 and a second microcontroller (e.g., 150_2 of FIG. 9) MC2, included in the microcontroller circuit of FIG. 9 (e.g., 150 of FIG. 9), and response signals output from the priority determination circuit (e.g., 170 of FIG. 9) are illustrated in FIG. 12, similarly to FIG. 10. As in the case of FIG. 10, MC3 may be the third microcontroller of FIG. 9 (e.g., 150_3 of FIG. 9), and MC4 may be the fourth microcontroller of FIG. 9 (e.g., 150_4 of FIG. 9).

As in the case of FIG. 10, in FIG. 12, it is assumed that a priority is determined in the sequence of the first microcontroller MC1, the second microcontroller MC2, the third microcontroller MC3, and the fourth microcontroller MC4.

Furthermore, FIG. 12 illustrates a write enable signal WT_EN and a read enable signal RD_EN which are generated in the priority determination circuit 170, data which is stored in first and second registers REG1 and REG2 included in the FIFO register of FIG. 8 (e.g., 175 of FIG. 8), and FIFO data FIFO_OUT which is output from the multiplexer of FIG. 8 (e.g., 177 of FIG. 8). As in the case of FIG. 10, in FIG. 12, default data values for the write enable signal WT_EN and the read enable signal RD_EN may be '00', and default data values initially stored in the first and second registers REG1 and REG2 may be '0000'.

In an embodiment, the first and second microcontrollers MC1 and MC2 may simultaneously receive a first command CMD1 and a second command CMD2, respectively, from an external device. Further, the first microcontroller MC1 may output a first request signal REQ_1 in a high state (1) to the priority determination circuit 170 in response to the first command CMD1 (REQ_1='1') at the same time that the second microcontroller MC2 may output a second request signal REQ_2 in a high state (1) to the priority determination circuit 170 in response to the second command CMD2 (REQ_2='1').

In an embodiment, because the first microcontroller MC1 has been designated to perform an operation with the highest priority, an operation corresponding to the first request signal REQ_1 in a high state (1) may be preferentially performed even if the first request signal REQ_1 in a high state (1) and the second request signal REQ_2 in a high state (1) are simultaneously received. Therefore, in response to the first request signal REQ_1 in a high state (1), the write enable signal WT_EN may change from a default data value of '00' to '01', and logical data '0001' may be stored in the first register REG1.

Also, because the changed write enable signal WT_EN is input to the FIFO register (e.g., 175 of FIG. 5), first register data REG_DATA1 stored in the first register REG1 may be output. Further, because the first register data REG_DATA1 and the read enable signal RD_EN are input to the multiplexer of FIG. 8 (e.g., 177 of FIG. 8) and the read enable signal RD_EN is a default data value of '00', the FIFO data FIFO_OUT may be '0001', which is the first register data REG_DATA1.

Therefore, based on the FIFO data FIFO_OUT, the first response signal ACK_1 in a high state (1), corresponding to the first request signal in a high state (REQ_1='1'), may be output from the priority determination circuit (e.g., 170 of FIG. 9), and may be provided to the first microcontroller MC1 (ACK_1='1'). When the first response signal in a high state (ACK_1='1') is received, the first microcontroller MC1 may initiate an operation.

In an embodiment, when the write enable signal WT_EN changes and logical data is stored in the first register REG1, an operation corresponding to the second request signal REQ_2 in a high state (1) may be performed. Therefore, in response to the second request signal REQ_2 in a high state (1), the write enable signal WT_EN may change from '01' to '10', and logical data '0010' may be stored in the second register REG2 and output from the second register REG2.

Because the changed write enable signal WT_EN is input to the FIFO register (e.g., 175 of FIG. 5), second register data REG_DATA2 stored in the second register REG2 may be output. However, because the read enable signal RD_EN has a default data value of '00' other than a changed data value, the FIFO data FIFO_OUT may still be '0001', which is the first register data REG_DATA1.

In an embodiment, after a predetermined period of time has elapsed because the first microcontroller MC1 received the first response signal ACK_1 in a high state (1) from the priority determination circuit 170, the first microcontroller MC1 may complete all of the operation corresponding to the first command CMD1. When the first microcontroller MC1 completes the operation, the first microcontroller MC1 may output the first request signal REQ_1 in a low state (0) indicating the completion of the operation to the priority determination circuit 170 (REQ_1='0').

When the first request signal REQ_1 in a low state (0) is received, the priority determination circuit 170 may output the first response signal ACK_1 in a low state (0) to the first microcontroller MC1 (ACK_1='0'), and may output a second response signal ACK_2 in a high state (1) to the second microcontroller MC2 (ACK_2='1'). That is, the first response signal ACK_1 in a low state (0) and the second response signal ACK_2 in a high state (1) may be simultaneously output from the priority determination circuit 170. The reason for this is that the operation of the first microcontroller MC1 has been completed, and thus the priority determination circuit 170 may control the microcontrollers so that, at the same time that the operation of the first microcontroller MC1 is terminated, the operation of the second microcontroller MC2 is initiated. By means of the operation of the priority determination circuit 170, the operations of the microcontrollers may be sequentially performed without overlapping each other.

Also, when the first request signal REQ_1 in a low state (0) is received, the read enable signal RD_EN may change from a default data value of '00' to '01', and the changed read enable signal RD_EN may be input to the multiplexer of FIG. 8 (e.g., 177 of FIG. 8). However, because the read enable signal RD_EN has a value of '01' which is the changed data value, the FIFO data FIFO_OUT may be '0010', which is the second register data REG_DATA2.

Thereafter, the second microcontroller MC2 may complete all of the operation corresponding to the second command CMD2, and then output the second request signal REQ_2 in a low state (0) indicating the completion of the operation to the priority determination circuit 170 (REQ_2='0'). Also, when the priority determination circuit 170 receives the second request signal REQ_2 in a low state (0), the read enable signal RD_EN may change from '01' to '10', and may be input to the multiplexer of FIG. 8 (e.g., 177 of FIG. 8). However, because data is not yet stored in the third register REG3, the FIFO data FIF0_OUT may be '0010', which is the second register data REG_DATA2.

In an embodiment, the priority determination circuit 170 may output the second response signal ACK_2 in a low state (0) in response to the second request signal REQ_2 in a low state (0). When the second response signal ACK_2 in a low state (0) is provided to the second microcontroller MC2, the second microcontroller MC2 may terminate the operation.

Figure 13:
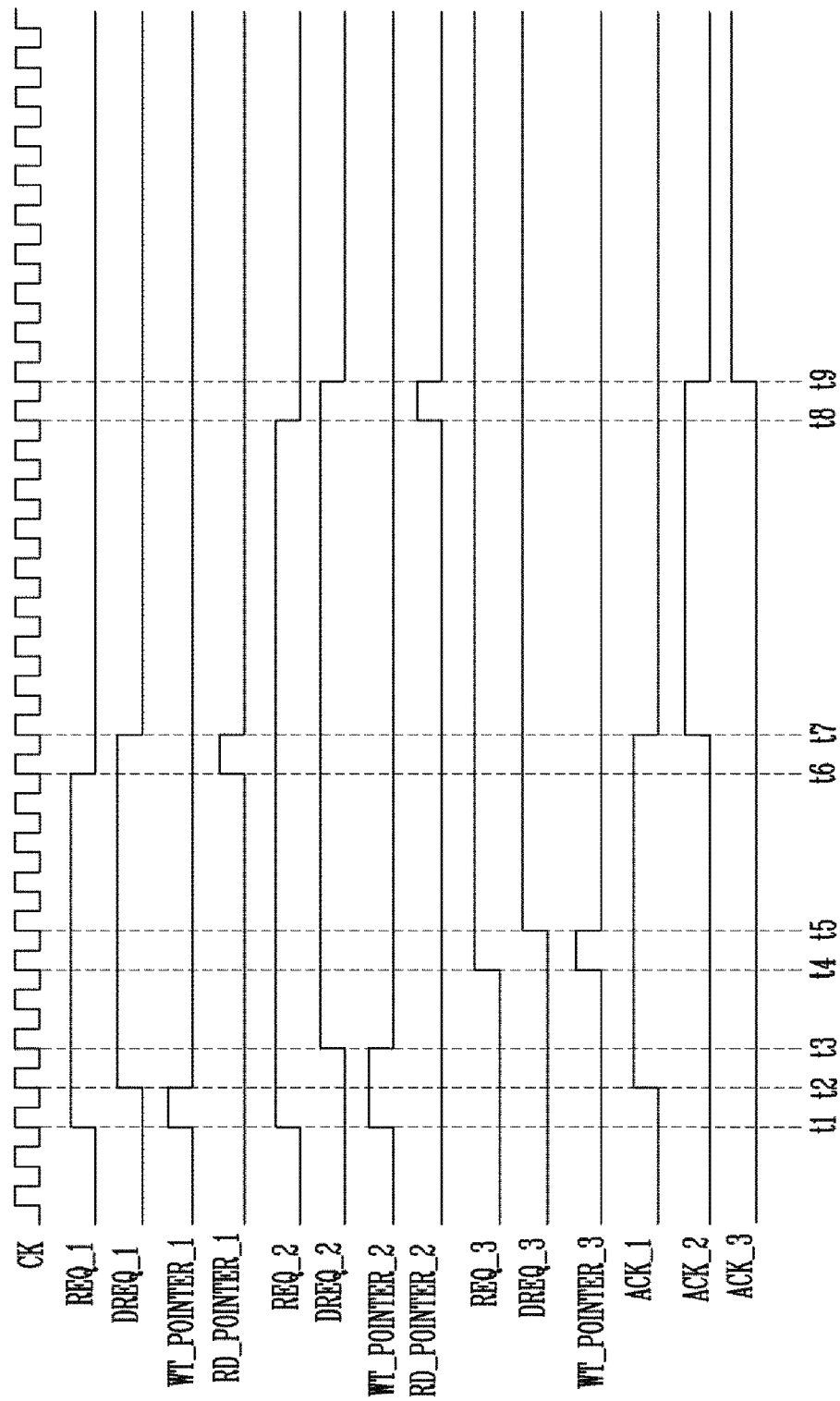
FIG. 13 is a diagram for explaining request signals input to the priority determination circuit and response signals output from the priority determination circuit.

FIG. 13 is a diagram for explaining request signals input to the priority determination circuit and response signals output from the priority determination circuit.

Referring to FIGS. 11 to 13, FIG. 13 illustrates request signals, which are input to the priority determination circuit and are generated in time sequence, and response signals, which are output from the priority determination circuit, when first and second commands CMD1 and CMD2 are received from an external device at the same time point. That is, FIG. 13 illustrates the operations of FIGS. 11 and 12 schematized in time sequence.

In an embodiment, the signals indicated in FIG. 13 may change from a high state to a low state or from a low state to a high state when a clock CLK makes a transition from a low state to a high state.

In an embodiment, at time t1 at which the clock CLK makes a transition from a low state to a high state, the first microcontroller 150_1 may output a first request signal REQ_1 in a high state (1) in response to the first command CMD1, and the second microcontroller 150_2 may output a second request signal REQ_2 in a high state (1) in response to the second command CMD2.

Also, referring to FIG. 6, the first request signal REQ_1 in a high state (1) may be input to a first flip-flop (e.g., 171_D1 of FIG. 6), and the second request signal REQ_2 in a high state (1) may be input to a second flip-flop (e.g., 171_D2 of FIG. 6). Here, a second masking signal MASKING_SIG_2 may be in a high state (1). That is, the second masking signal MASKING_SIG_2 corresponding to the second request signal REQ_2 in a high state (1) may be in a high state such that the first microcontroller 150_1 is preferentially operated.

At time t2, the first request signal REQ_1 in a high state (1), which is input to the first flip-flop (e.g., 171_D1 of FIG. 6), may be delayed, and then a first delayed request signal DREQ_1 in a high state (1) may be output.

Further, when the first request signal REQ_1 changes from a low state (0) to a high state (1), the first write pointer WT_POINTER_1 may change from a low state (0) to a high state (1) together with the first request signal. Then, when the first delayed request signal DREQ_1 changes from a low state (0) to a high state (1), the first write pointer WT_POINTER_1 may change from a high state (1) to a low state (0). As a result, the first write pointer WT_POINTER_1 may be in a high state (1) during an interval from t1 to t2, and logical data '0001' may be stored in the first register of FIG. 8 (e.g., REG1 of FIG. 8) based on the first write pointer WT_POINTER_1. That is, the first write pointer WT_POINTER_1 may be maintained in a high state (1) during an interval from a time point at which the first request signal REQ_1 changes to a high state (1) to a time point at which the first delayed request signal DREQ_1 changes to a high state (1), and the logical data '0001' may be stored in the first register of FIG. 8 (e.g., REG1 of FIG. 8) based on the first write pointer WT_POINTER_1 in a high state (1).

A second delayed request signal DREQ_2 corresponding to the second request signal REQ_2 in a high state (1) may change from a low state (0) to a high state (1) at time t3 after the logical data has been stored in the first register of FIG. 8 (e.g., REG1 of FIG. 8). Therefore, when the second request signal REQ_2 changes from a low state (0) to a high state (1), the second write pointer WT_POINTER_2 may change from a low state (0) to a high state (1) together with the second request signal. Then, when the second delayed request signal DREQ_2 changes from a low state (0) to a high state (1), the second write pointer WT_POINTER_2 may change from a high state (1) to a low state (0). As a result, the second write pointer WT_POINTER_2 may be in a high state (1) during an interval from t1 to t3, and logical data '0010' may be stored in the second register of FIG. 8 (e.g., REG2 of FIG. 8) based on the second write pointer WT_POINTER_2. That is, the second write pointer WT_POINTER_2 may be maintained in a high state (1) during an interval from a time point at which the second request signal REQ_2 changes to a high state (1) to a time point at which the second delayed request signal DREQ_2 changes to a high state (1), and the logical data '0010' may be stored in the second register of FIG. 8 (e.g., REG2 of FIG. 8) based on the second write pointer WT_POINTER_2 in a high state (1).

In an embodiment, after the first write pointer WT_POINTER_1 having changed to a high state (1) has been output, a first response signal ACK_1 in a high state (1) may be output at time t2. That is, the priority determination circuit 170 may output the first response signal ACK_1 in a high state (1) for instructing the first microcontroller 150_1 to initiate an operation so that the first microcontroller 150_1 may preferentially perform an operation. When the first response signal ACK_1 in a high state (1) is received, the first microcontroller 150_1 may initiate the operation.

In an embodiment, while the first microcontroller 150_1 performs an operation, the microcontroller circuit 150 may receive a third command CMD3 for instructing an operation to be performed on a third plane PLANE3 from the external device. When the third command CMD3 is provided to the third microcontroller 150_3, the third microcontroller 150_3 may output a third request signal REQ_3 in a high state (1).

This operation is performed after the logical data '0001' has been stored in the first register of FIG. 8 (e.g., REG1 of FIG. 8) and the logical data '0010' has been stored in the second register of FIG. 8 (e.g., REG2 of FIG. 8). Accordingly, when the third request signal REQ_3 in a high state (1) is input to the third flip-flop (e.g., 171_D3 of FIG. 6), a third delayed request signal DREQ_3 in a high state (1) may be output at time t5.

At this time, a third masking signal MASKING_SIG_3 may be in a high state (1). That is, the third masking signal MASKING_SIG_3 corresponding to the third request signal REQ_3 in a high state (1) may be in a high state such that the first and second microcontrollers 150_1 and 150_2 are preferentially operated.

In an embodiment, when the third request signal REQ_3 changes from a low state (0) to a high state (1), the third write pointer WT_POINTER_3 may change from a low state (0) to a high state (1) together with the third request signal. Then, when the third delayed request signal DREQ_3 changes from a low state (0) to a high state (1), the third write pointer WT_POINTER_3 may change from a high state (1) to a low state (0). As a result, the third write pointer WT_POINTER_3 may be in a high state (1) during an interval from t4 to t5, and logical data '0100' may be stored in the third register of FIG. 8 (e.g., REG3 of FIG. 8) based on the third write pointer WT_POINTER_3. That is, the third write pointer WT_POINTER_3 may be maintained in a high state (1) during an interval from a time point at which the third request signal REQ_3 changes to a high state (1) to a time point at which the third delayed request signal DREQ_3 changes to a high state (1), and the logical data '0100' may be stored in the third register of FIG. 8 (e.g., REG3 of FIG. 8) based on the third write pointer WT_POINTER_3 in a high state (1).

Thereafter, the first microcontroller 150_1 may complete all of the operation corresponding to the first command CMD1. Therefore, at time t6, that is, at a time point at which the first microcontroller 150_1 completes the operation, the first microcontroller 150_1 may output the first request signal REQ_1 in a low state (0), indicating the completion of the operation, to the priority determination circuit 170. As the first request signal REQ_1 in a low state (0) is output, the first delayed request signal DREQ_1 in a low state (0) may be output at time t7.

Furthermore, when the first request signal REQ_1 changes from a high state (1) to a low state (0), a first read pointer RD_POINTER_1 may change from a low state (0) to a high state (1). Then, when the first delayed request signal DREQ_1 changes from a high state (1) to a low state (0), the first read pointer RD_POINTER_1 may change from a high state (1) to a low state (0). That is, the first read pointer RD_POINTER_1 may be maintained in the high state (1) during an interval from a time point at which the first request signal REQ_1 changes to a low state (0) to a time point at which the first delayed request signal DREQ_1 changes to a low state (0).

Consequently, the first read pointer RD_POINTER_1 may be in a high state (1) during an interval from t6 to t7, and the read enable signal RD_EN having a changed data value may be output based on the changed first read pointer RD_POINTER_1. Also, as the read enable signal RD_EN having the changed data value is output, the first response signal ACK_1 may change from a high state (1) to a low state (0). That is, the first response signal ACK_1 may be maintained in the high state (1) during an interval from a time point at which the first write pointer WT_POINTER_1 changes to a low state (0) to a time point at which the first read pointer RD_POINTER_1 changes to a low state (0).

In an embodiment, when the first response signal ACK_1 in a low state (0) is output, the operation of the first microcontroller 150_1 is terminated, and thus the operation of the second microcontroller 150_2 may be initiated. That is, at time t7, at the same time that the first response signal ACK_1 in a low state (0) is output, a second response signal ACK_2 in a high state (1) may be output, and the second microcontroller 150_2 having received the second response signal ACK_2 in a high state (1) may initiate an operation.

Thereafter, the second microcontroller 150_2 may complete all of the operation corresponding to the second command CMD2. Therefore, at time t8, that is, at a time point at which the second microcontroller 150_2 completes the operation, the second microcontroller 150_2 may output the second request signal REQ_2 in a low state (0), indicating the completion of the operation, to the priority determination circuit 170. As the second request signal REQ_2 in a low state (0) is output, the second delayed request signal DREQ_2 in a low state (0) may be output at time t9.

Furthermore, when the second request signal REQ_2 changes from a high state (1) to a low state (0), a second read pointer RD_POINTER_2 may change from a low state (0) to a high state (1). Then, when the second delayed request signal DREQ_2 changes from a high state (1) to a low state (0), the second read pointer RD_POINTER_2 may change from a high state (1) to a low state (0). That is, the second read pointer RD_POINTER_2 may be maintained in the high state (1) during an interval from a time point at which the second request signal REQ_2 changes to a low state (0) to a time point at which the second delayed request signal DREQ_2 changes to a low state (0).

Consequently, the second read pointer RD_POINTER_2 may be in a high state (1) during an interval from t8 to t9, and the read enable signal RD_EN having a changed data value may be output based on the changed second read pointer RD_POINTER_2. Also, as the read enable signal RD_EN having the changed data value is output, the second response signal ACK_2 may change from a high state (1) to a low state (0). That is, the second response signal ACK_2 may be maintained in the high state (1) during an interval from a time point at which the second write pointer WT_POINTER_2 changes to a low state (0) to a time point at which the second read pointer RD_POINTER_2 changes to a low state (0).

When the second response signal ACK_2 in a low state (0) is output, the operation of the second microcontroller 150_2 is terminated, and thus the operation of the third microcontroller 150_3 may be initiated. That is, at time t9, at the same time that the second response signal ACK_2 in a low state (0) is output, a third response signal ACK_3 in a high state (1) may be output, and the third microcontroller 150_3 having received the third response signal ACK_3 in a high state (1) may initiate an operation.

Figure 14:
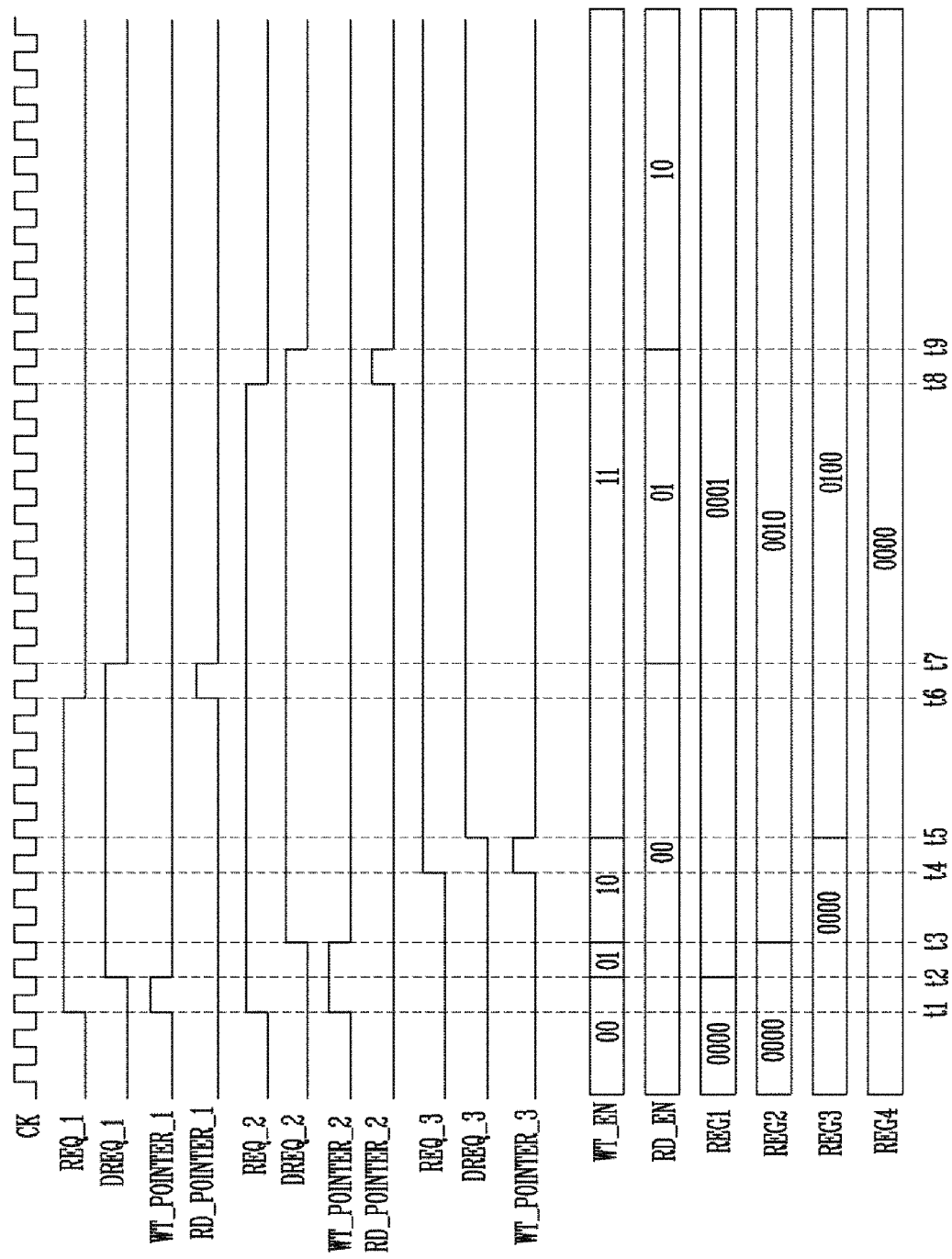
FIG. 14 is a diagram for explaining a write enable signal and a read enable signal that are set based on request signals and response signals, and data that is stored in a FIFO register.

FIG. 14 is a diagram for explaining a write enable signal and a read enable signal that are set based on request signals and response signals, and data that is stored in a FIFO register.

Referring to FIGS. 11 to 14, when first and second commands CMD1 and CMD2 are received from an external device at the same time point, a write enable signal WT_EN, a read enable signal RD_EN, and data stored in the FIFO register (e.g., 175 of FIG. 8) are illustrated in FIG. 14, similarly to FIG. 13. That is, FIG. 14 illustrates the operations of FIGS. 11 and 12 schematized in time sequence.

In FIG. 14, because first to third request signals REQ_1 to REQ3, first to third delayed request signals DREQ_1 to DREQ_3, first to third write pointers WT_POINTER_1 to WT_POINTER_3, and first and second read pointers RD_POINTER_1 and RD_POINTER_2 are identical to those of FIG. 13, repeated descriptions of operations identical to those in FIG. 13 will be omitted.

In an embodiment, the initial data value of each of the write enable signal WT_EN and the read enable signal RD_EN may be a default value of '00'. Also, a data value initially stored in first to fourth registers (e.g., REG1 to REG4 of FIG. 8) included in the FIFO register of FIG. 8 (e.g., 175 of FIG. 8) may be '0000'.

After the FIFO register of FIG. 8 (e.g., 175 of FIG. 8) receives the first write pointer WT_POINTER_1 in a high state (1) during an interval from t1 to t2, the write enable signal WT_EN may change from a default data value of '00' to '01', and logical data '0001' may be stored in the first register (e.g., REG1 of FIG. 8) at time t2. The logical data '0001' stored in the first register (e.g., REG1 of FIG. 8) may be output to the multiplexer (e.g., 177 of FIG. 8) in response to the changed write enable signal WT_EN.

Then, after the FIFO register of FIG. 8 (e.g., 175 of FIG. 8) has received the second write pointer WT_POINTER_2 in a high state (1) during an interval from t1 to t3, the write enable signal WT_EN may change from '01' to '10' and logical data '0010' may be stored in the second register (e.g., REG2 of FIG. 8), at time t3. The logical data '0010' stored in the second register (e.g., REG2 of FIG. 8) may be output to the multiplexer (e.g., 177 of FIG. 8) in response to the changed write enable signal WT_EN.

Then, after the FIFO register of FIG. 8 (e.g., 175 of FIG. 8) has received the third write pointer WT_POINTER_3 in a high state (1) during an interval from t4 to t5, the write enable signal WT_EN may change from '10' to '11' and logical data '0100' may be stored in the third register (e.g., REG3 of FIG. 8), at time t5. The logical data '0100' stored in the third register (e.g., REG3 of FIG. 8) may be output to the multiplexer (e.g., 177 of FIG. 8) in response to the changed write enable signal WT_EN.

Although not illustrated in the drawing, when the FIFO register of FIG. 8 (e.g., 175 of FIG. 8) receives the fourth write pointer WT_POINTER_4 in a high state (1), the write enable signal WT_EN may change from '11' to '00', and logical data '1000' may be stored in the fourth register (e.g., REG4 of FIG. 8).

In an embodiment, based on a first read pointer RD_POINTER_1 in a high state (1), which is output during an interval from t6 to t7, the read enable signal RD_EN having changed from '00' to '01' may be generated at time t7. The changed read enable signal RD_EN may be input to the multiplexer of FIG. 8 (e.g., 177 of FIG. 8). When the changed read enable signal RD_EN is input to the multiplexer of FIG. 8 (e.g., 177 of FIG. 8), the multiplexer of FIG.

8 (e.g., 177 of FIG. 8) may receive second register data REG_DATA2 stored in the second register REG2, which is a next register, and may output the second register data REG_DATA2.

Thereafter, based on a second read pointer RD_POINTER_2 in a high state (1), which is output during an interval from t8 to t9, the read enable signal RD_EN having changed from '01' to '10' may be generated at time t9. The changed read enable signal RD_EN may be input to the multiplexer of FIG. 8 (e.g., 177 of FIG. 8). When the changed read enable signal RD_EN is input to the multiplexer of FIG. 8 (e.g., 177 of FIG. 8), the multiplexer of FIG. 8 (e.g., 177 of FIG. 8) may receive third register data REG_DATA3 stored in the third register REG3, which is a next register, and may output the third register data REG_DATA3.

Figure 15:
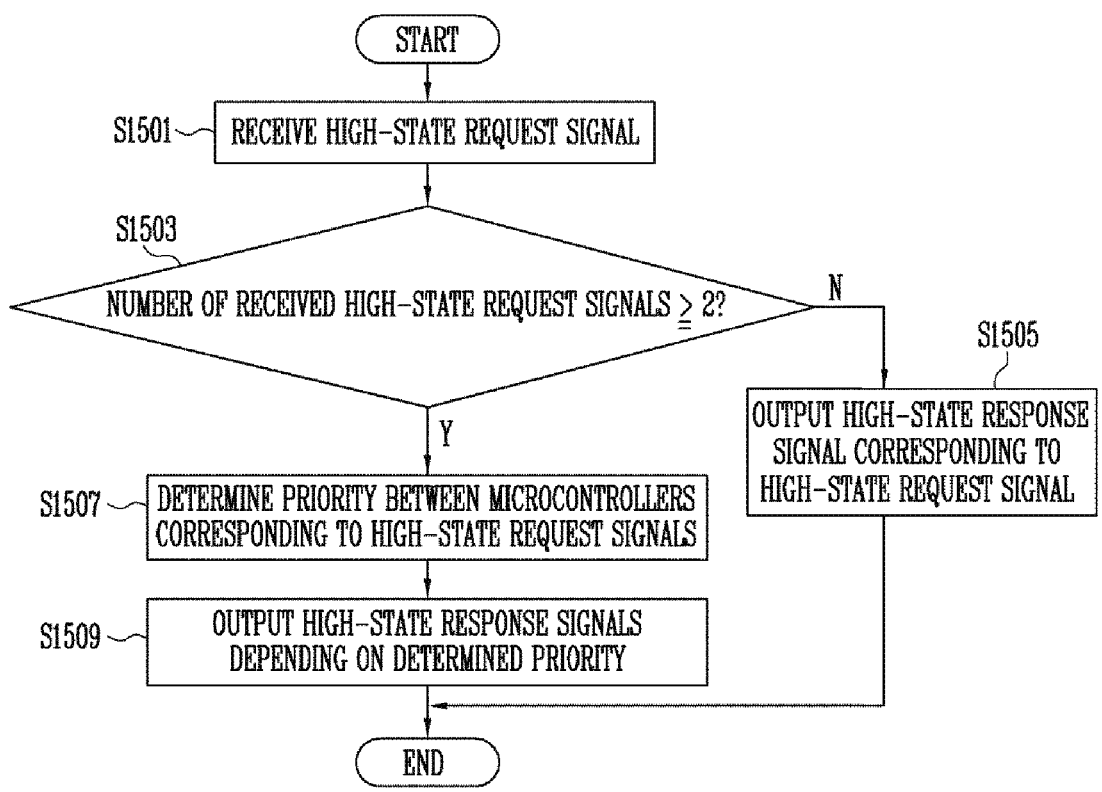
FIG. 15 is a flowchart illustrating the operation of the priority determination circuit according to an embodiment of the present disclosure.

FIG. 15 is a flowchart illustrating the operation of the priority determination circuit according to an embodiment of the present disclosure.

Referring to FIG. 15, at step S1501, the priority determination circuit may receive a high-state request signal from a microcontroller circuit.

For example, the microcontroller circuit may receive a command from an external device. The command received from the external device may be a command for instructing an operation to be performed on at least one of a plurality of planes included in a memory device. Therefore, the microcontroller circuit may provide the corresponding command to a microcontroller corresponding to the command received from the external device, and the microcontroller may output a high-state request to perform an operation corresponding to the command. The high-state request signal may be a signal requesting the initiation of an operation.

In an embodiment, when commands for instructing operations to be performed on at least two of the plurality of planes are received from the external device, the plurality of microcontrollers may output high-state request signals to perform operations respectively corresponding to the commands.

At step S1503, the priority determination circuit may determine whether the number of high-state request signals received from the microcontroller circuit is equal to or greater than 2. That is, the priority determination circuit may determine whether there is a need to determine the priority between the microcontrollers because a plurality of high-state request signals are received. When the number of received high-state request signals is equal to or greater than 2 (in case of Y), the process may proceed to step S1507, whereas when the number of received high-state request signals is not equal to or greater than 2, the process may proceed to step S1505.

When the number of high-state request signals, received from the microcontroller circuit, is not equal to or greater than 2 (in case of N), that is, when one high-state request signal is received, the priority determination circuit does not need to determine the priority between the microcontrollers. Therefore, the priority determination circuit may output a high-state response signal corresponding to the high-state request signal at step S1505. However, when another microcontroller is in operation, the priority determination circuit may output a high-state response signal after the operation of the corresponding microcontroller has been terminated.

When the number of high-state request signals, received from the microcontroller circuit, is equal to or greater than 2 (in case of Y), the priority determination circuit may determine the priority between the microcontrollers corresponding to the high-state request signals at step S1507.

That is, the priority between the microcontrollers may be determined such that the operations of the microcontrollers do not overlap each other.

For example, when first to fourth microcontrollers are included in the microcontroller circuit, the priority may be determined such that operations are sequentially performed in the sequence of the first to fourth microcontrollers. In this case, the first microcontroller may be determined to first perform an operation.

When the priority between the microcontrollers is determined, high-state response signals may be output depending on the determined priority at step S1509. That is, when a high-state response signal corresponding to the microcontroller determined to first perform the operation may be output, and the corresponding microcontroller may initiate the operation. Even in this case, when another microcontroller is in operation, a high-state response signal may be output after the operation of the corresponding microcontroller has been terminated.

Figure 16:
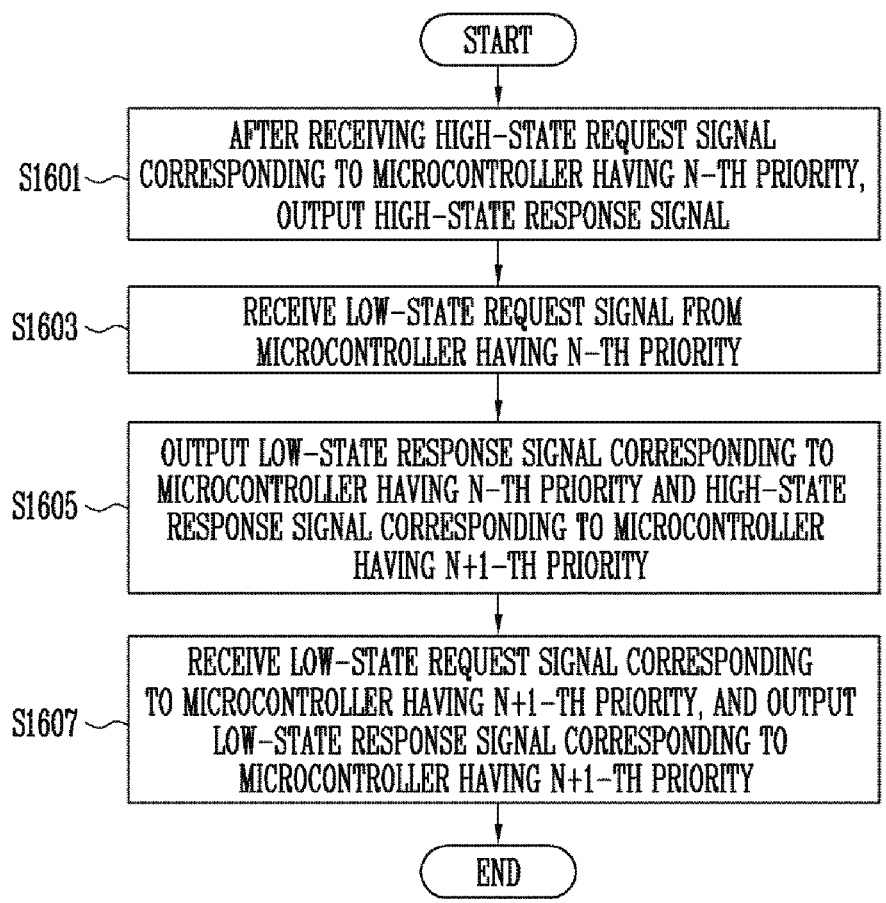
FIG. 16 is a flowchart illustrating the operation of the priority determination circuit according to an embodiment of the present disclosure.

FIG. 16 is a flowchart illustrating the operation of the priority determination circuit according to an embodiment of the present disclosure.

Referring to FIG. 16, FIG. 16 sequentially illustrates response signals output from the priority determination circuit after the priority between the microcontrollers has been determined. In FIG. 16, N is assumed to be a natural number.

At step S1601, the priority determination circuit may receive a high-state request signal corresponding to a microcontroller having N-th priority, and may then output a high-state response signal. That is, the high-state response signal, corresponding to the microcontroller on which an operation is to be preferentially performed, may be output. Here, the high-state response signal may be a signal for instructing the microcontroller having N-th priority to initiate the operation. Therefore, after the high-state response signal has been received, the microcontroller having the N-th priority may initiate the operation.

Thereafter, when the microcontroller having the N-th priority completes the operation, the priority determination circuit may receive a low-state request signal, indicating that the operation of the microcontroller having the N-th priority has been completed, from the microcontroller having the N-th priority at step S1603.

When the low-state request signal is received, a low-state response signal corresponding to the microcontroller having an N-th priority may be output so as to terminate the operation of the microcontroller having an N-th priority. At this time, together with the low-state response signal corresponding to the microcontroller having an N-th priority, a high-state response signal corresponding to a microcontroller having an N+1-th priority may be output at step S1605. The high-state response signal may be a signal for instructing the corresponding microcontroller to initiate an operation.

That is, in order to instruct the microcontroller having an N+1-th priority, which is a next microcontroller, to initiate an operation while terminating the operation of the microcontroller having an N-th priority, a high-state response signal corresponding to the microcontroller having an N+1-th priority, together with the low-state response signal corresponding to the microcontroller having an N-th priority, may be output.

Thereafter, when the microcontroller having an N+1-th priority completes the operation, the priority determination circuit may receive a low-state request signal, indicating that the operation of the microcontroller having an N+1-th priority has been completed, from the microcontroller having an N+1-th priority. Further, when the low-state request signal is received, a low-state response signal corresponding to the microcontroller having an N+1-th priority may be output so as to terminate the operation of the microcontroller having an N+1-th priority at step S1607.

Figure 17:
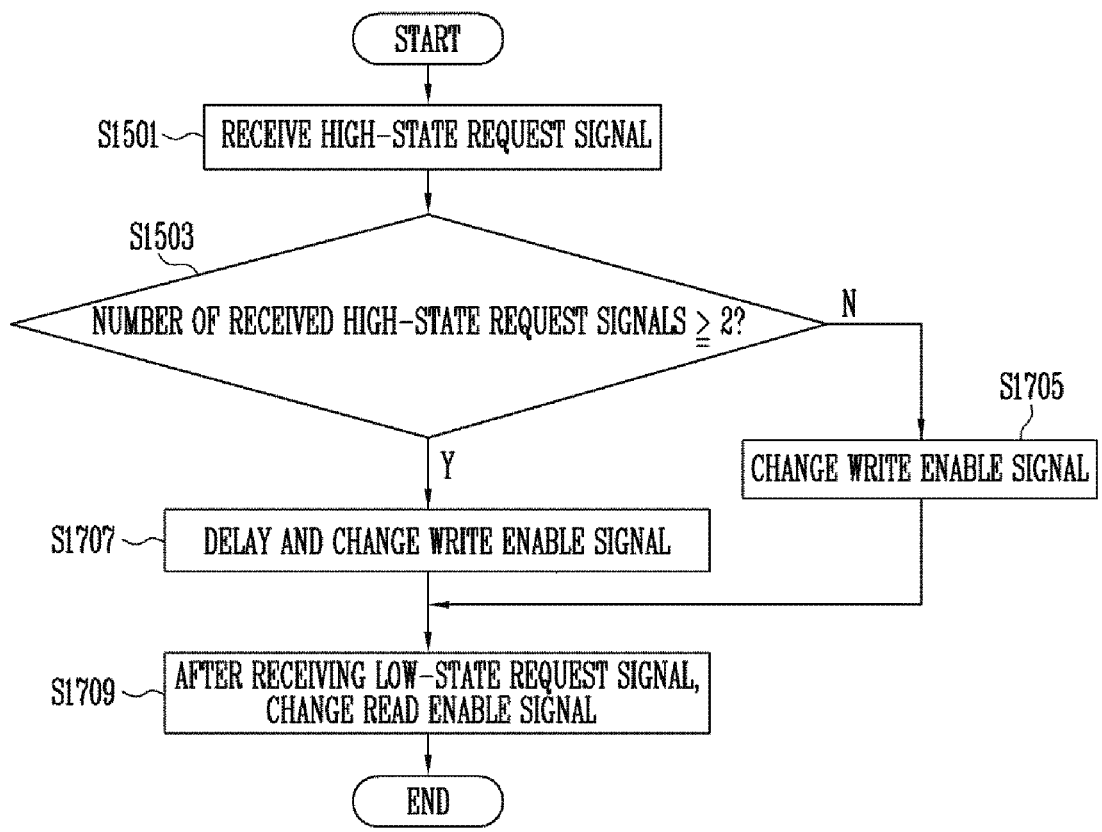
FIG. 17 is a flowchart illustrating the operation of the priority determination circuit according to an embodiment of the present disclosure.

FIG. 17 is a flowchart illustrating the operation of the priority determination circuit according to an embodiment of the present disclosure.

Referring to FIG. 17, a process for determining the priority between microcontrollers and then sequentially operating the microcontrollers is illustrated in FIG. 17.

At step S1501, the priority determination circuit may receive a high-state request signal from a microcontroller circuit.

For example, the microcontroller circuit may receive a command from an external device. The command received from the external device may be a command for instructing an operation to be performed on at least one of a plurality of planes included in a memory device. Therefore, the microcontroller circuit may provide the corresponding command to a microcontroller corresponding to the command received from the external device, and the microcontroller may output a request signal in a high state so as to perform an operation corresponding to the command. The request signal in a high state may be a signal requesting the initiation of an operation.

In an embodiment, when commands for instructing operations to be performed on at least two of the plurality of planes, are received from the external device, the plurality of microcontrollers may output high-state request signals to perform operations respectively corresponding to the commands.

At step S1503, the priority determination circuit may determine whether the number of high state request signals received from the microcontroller circuit is equal to or greater than 2. That is, the priority determination circuit may determine whether there is a need to determine the priority between the microcontrollers because a plurality of high-state request signals are received. When the number of received high-state request signals is equal to or greater than 2 (in case of Y), the process may proceed to step S1707, whereas when the number of received high-state request signals is not equal to or greater than 2, the process may proceed to step S1705.

When the number of high-state request signals, received from the microcontroller circuit, is not equal to or greater than 2 (in case of N), that is, when one high-state request signal is received, the priority determination circuit may change a write enable signal at step S1705. That is, data corresponding to the write enable signal may change from a default data value of '00' to '01'. Because there is no need to determine the priority between the microcontrollers, data corresponding to the write enable signal may change in response to the high-state request signal.

However, when it is determined that the number of high-state request signals, received from the microcontroller circuit, is equal to or greater than 2 (in case of Y), the priority determination circuit may change the write enable signal by delaying the write enable signal at step S1707. That is, based on the high-state request signal corresponding to the microcontroller determined to first perform an operation, the data corresponding to the write enable signal has changed from a default data value of '00' to '01'. Thereafter, based on the high-state request signal corresponding to a microcontroller determined to subsequently perform an operation, data corresponding to the write enable signal may change from '01' to '10'. That is, the write enable signal may be delayed and changed.

When a low-state request signal is received after the write enable signal has been delayed and changed, the read enable signal may change in response to the low-state request signal at step S1709. For example, in the case of the read enable signal, when a low-state delayed request signal is received after the low-state request signal has been received, data corresponding to the read enable signal may change from a default data value of '00' to '01'.

Figure 18:
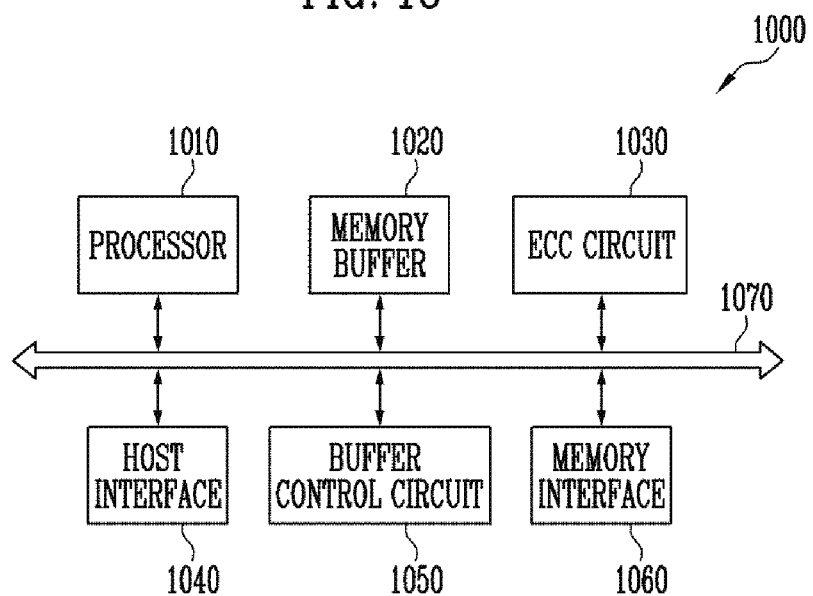
FIG. 18 is a diagram illustrating an embodiment of a memory controller of FIG. 1.

FIG. 18 is a diagram illustrating an embodiment of a memory controller of FIG. 1.

A memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 18, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may run software or firmware to perform the randomizing or derandomizing operation.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC circuit 1030 may perform error correction. The ECC circuit 1030 may perform error correction code (ECC) encoding based on data to be written to the memory device through the memory interface 1060. The ECC-encoded data may be transferred to the memory device through the memory interface 1060. The ECC circuit 1030 may perform ECC decoding based on data received from the memory device through the memory interface 1060. In an example, the ECC circuit 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 might not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 19:
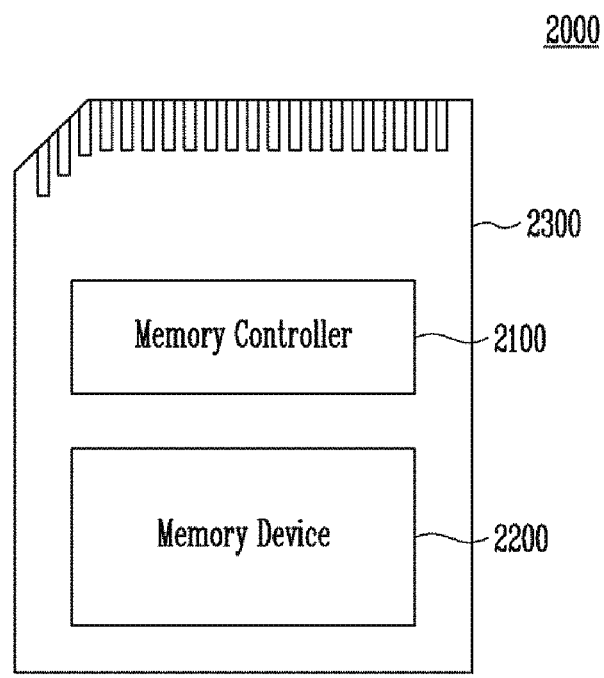
FIG. 19 is a block diagram illustrating a memory card system to which a storage device according to an embodiment of the present disclosure is applied.

FIG. 19 is a block diagram illustrating a memory card system to which the storage device according to an embodiment of the present disclosure is applied.

Referring to FIG. 19, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory device 2200 may be implemented in the same way as the memory devices (e.g., 100 of FIG. 2) described above with reference to FIG. 2.

In an embodiment, the memory controller 2100 may include components, such as a RAM, a processor, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin-Torque Magnetic RAM (STT-M RAM).

In an embodiment, the memory device 2200 may include a plurality of planes. Here, when the plurality of planes are simultaneously operated, an operation performed on any one plane may influence operations performed on other planes. Therefore, there is a need to determine the priority between the operations to be performed on the plurality of planes. The memory device 2200 may include a priority determination circuit for determining the priority between operations to be performed on the plurality of planes.

In an embodiment, a microcontroller circuit may include microcontrollers, which control operations to be performed on respective planes, for respective planes. For example, the microcontroller circuit may include a first microcontroller corresponding to a first plane, a second microcontroller corresponding to a second plane, a third microcontroller corresponding to a third plane, and a fourth microcontroller corresponding to a fourth plane.

Referring to the foregoing example, the determination of the priority between the operations to be performed on the plurality of planes may be the determination of the priority between the operations of the first to fourth microcontrollers.

Therefore, in order to determine the priority between the microcontrollers, the priority determination circuit may determine the priority of operations based on request signals received from the microcontrollers corresponding to respective planes, and may output response signals in a high state or a low state so that the microcontrollers are operated depending on the determined priority.

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 20:
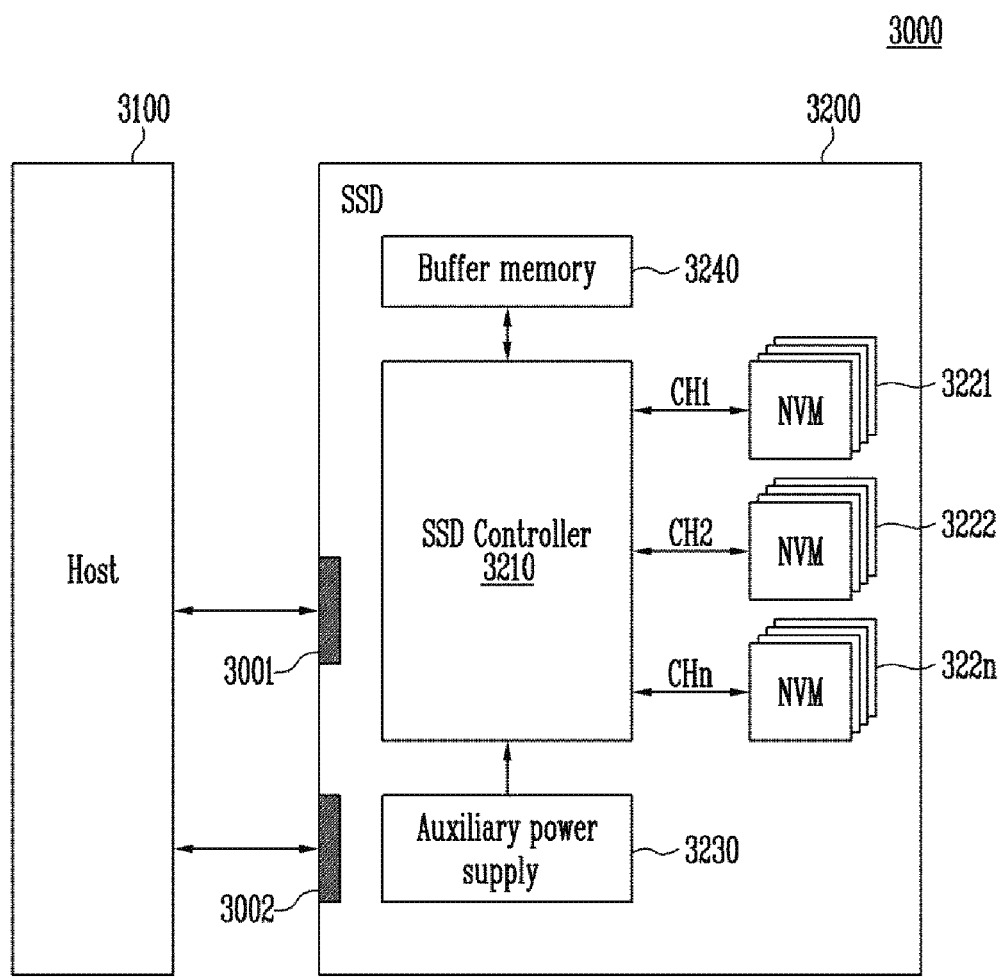
FIG. 20 is a block diagram illustrating, for example, a solid state drive (SSD) system to which a storage device according to an embodiment of the present disclosure is applied.

FIG. 20 is a block diagram illustrating an example of a solid state drive (SSD) system to which the storage device according to an embodiment of the present disclosure is applied.

Referring to FIG. 20, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controllers (e.g., 200 of FIG. 1) described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

Each of the plurality of flash memories 3221 to 322n may include a plurality of planes. Here, when the plurality of planes are simultaneously operated, an operation performed on any one plane may influence operations performed on other planes. Therefore, there is a need to determine the priority between the operations to be performed on the plurality of planes. Each of the plurality of flash memories 3221 to 322n may include a priority determination circuit for determining the priority between operations to be performed on the plurality of planes.

In an embodiment, a microcontroller circuit may include microcontrollers, which control operations to be performed on respective planes, for respective planes. For example, the microcontroller circuit may include a first microcontroller corresponding to a first plane, a second microcontroller corresponding to a second plane, a third microcontroller corresponding to a third plane, and a fourth microcontroller corresponding to a fourth plane.

Referring to the foregoing example, the determination of the priority between the operations to be performed on the plurality of planes may be the determination of the priority between the operations of the first to fourth microcontrollers.

Therefore, in order to determine the priority between the microcontrollers, the priority determination circuit may determine the priority of operations based on request signals received from the microcontrollers corresponding to respective planes, and may output response signals in a high state or a low state so that the microcontrollers are operated depending on the determined priority.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 21:
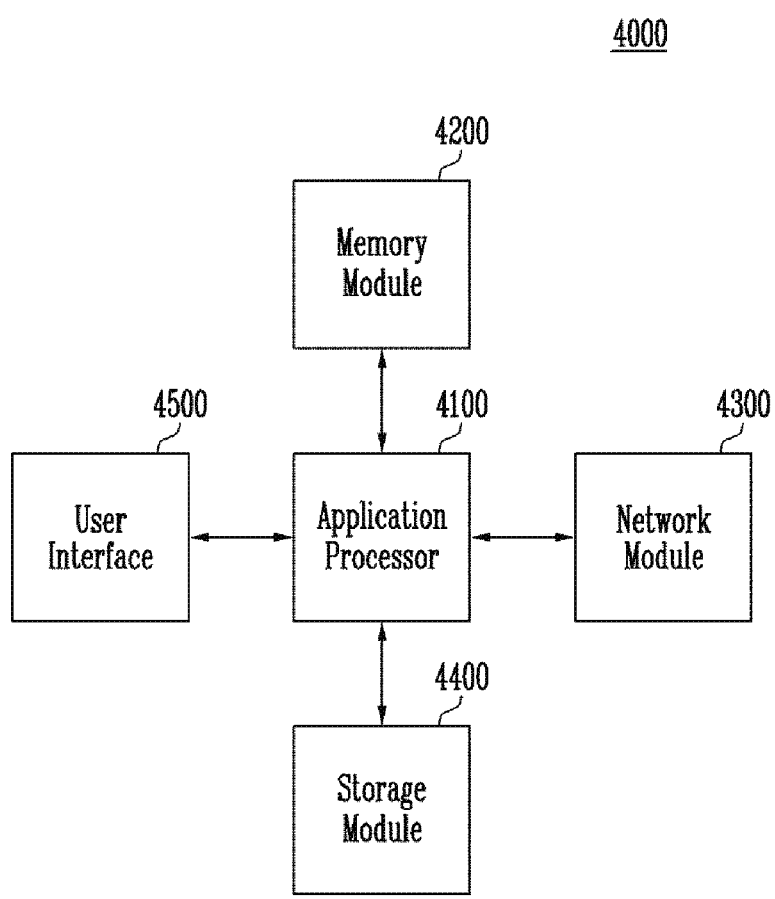
FIG. 21 is a block diagram illustrating a user system to which a storage device according to an embodiment of the present disclosure is applied.

FIG. 21 is a block diagram illustrating a user system to which the storage device according to an embodiment of the present disclosure is applied.

Referring to FIG. 21, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

In an embodiment, the storage module 4400 may include a plurality of planes. Here, when the plurality of planes are simultaneously operated, an operation performed on any one plane may influence operations performed on other planes. Therefore, there is a need to determine the priority between the operations to be performed on the plurality of planes. The storage module 4400 may include a priority determination circuit for determining the priority between operations to be performed on the plurality of planes.

In an embodiment, a microcontroller circuit may include microcontrollers, which control operations to be performed on respective planes, for respective planes. For example, the microcontroller circuit may include a first microcontroller corresponding to a first plane, a second microcontroller corresponding to a second plane, a third microcontroller corresponding to a third plane, and a fourth microcontroller corresponding to a fourth plane.

Referring to the foregoing example, the determination of the priority between the operations to be performed on the plurality of planes may be the determination of the priority between the operations of the first to fourth microcontrollers.

Therefore, in order to determine the priority between the microcontrollers, the priority determination circuit may determine the priority of operations based on request signals received from the microcontrollers corresponding to respective planes, and may output response signals in a high state or a low state so that the microcontrollers are operated depending on the determined priority.

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory devices described above with reference to FIGS. 2 and 3. The storage module 4400 may be operated in the same way as the storage devices 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, write pointers and read pointers are set in response to requests received from microcontrollers, and responses for allowing the microcontrollers to initiate operations are output based on the set write pointers and read pointers, thus enabling operations to be performed on a plurality of planes without overlapping the operations of the planes with each other.

What is claimed is:

1. A priority determination circuit configured to:
receive request signals corresponding to operations to be performed on a plurality of planes, each comprising a plurality of memory blocks, from a plurality of microcontrollers respectively corresponding to the plurality of planes:
determine a priority of the operations corresponding to the plurality of planes based on the received request signals; and
output response signals, the response signals corresponding to the request signals, depending on the determined priority,
wherein the priority determination circuit is configured to, when a first request signal in a high state is received from any one of the plurality of microcontrollers, output a first response signal in a high state for instructing an operation to be initiated.

2. The priority determination circuit according to claim 1, wherein the plurality of microcontrollers are configured to:
sequentially initiate operations in a sequence corresponding to a sequence of reception of the response signals in a high state; and
sequentially terminate the operations in a sequence corresponding to a sequence of reception of the response signals in a low state.

3. The priority determination circuit according to claim 1, wherein the plurality of microcontrollers are configured to output the request signals in a high state in response to respective commands received from an external device.

4. The priority determination circuit according to claim 3, wherein the plurality of microcontrollers are configured to initiate the operations that correspond to the request signals having a high state.

5. The priority determination circuit according to claim 1, wherein the priority determination circuit is configured such that, when a second request signal in a high state for requesting an instruction for initiating an operation of an additional microcontroller is received from the additional microcontroller while any one of the plurality of microcontrollers is in operation in response to the first response signal in a high state, a second response signal in a high state for instructing the additional microcontroller to initiate the operation is output after the first request signal in a low state indicating that the operation has been completed is received from the microcontroller in operation.

6. The priority determination circuit according to claim 5, wherein the priority determination circuit is configured to output the first response signal in a low state for instructing an operation to be terminated, together with the second response signal in a high state.

7. The priority determination circuit according to claim 1, wherein the priority determination circuit is configured to, when request signals in a high state are received from at least two of the plurality of microcontrollers, output a third response signal in a high state for instructing an operation to be initiated to a microcontroller corresponding to a plane having a highest priority depending on the determined priority.

8. The priority determination circuit according to claim 7, wherein the priority determination circuit is configured to, when a third request signal in a low state indicating that the operation has been completed is received from the microcontroller corresponding to the plane having the highest priority, output the third response signal in a low state for instructing the operation to be terminated.

9. The priority determination circuit according to claim 8, wherein the priority determination circuit outputs, together with the third response signal in a low state, a fourth response signal in a high state for instructing an operation to be initiated to a microcontroller corresponding to a plane having a next-highest priority presenting to be operated.

10. A priority determination circuit, comprising:
a request signal delay component configured to receive request signals corresponding to operations to be performed on a plurality of planes, from a plurality of microcontrollers respectively corresponding to the plurality of planes, and to output delayed request signals obtained by delaying the request signals;
a write/read pointer output circuit configured to generate a write pointer and a read pointer based on the request signals and the delayed request signals to set a priority among the received request signals;

a First-In, First-Out (FIFO) register configured to store data based on the write pointer and output the stored data in response to a write enable signal generated based on the write pointer;

a multiplexer configured to output FIFO data based on register data output from the FIFO register and a read enable signal generated depending on the read pointer; and a response signal generator configured to output response signals for instructing any one of the plurality of microcontrollers to initiate or terminate an operation based on the FIFO data and the delayed request signals.

11. The priority determination circuit according to claim 10, wherein:

the plurality of microcontrollers are configured to request instructions for the initiation of the operations corresponding to the request signals when the request signals are in a high state, and when the request signals are in a low state, the request signals are signals indicating that the operations of the plurality of microcontrollers have been completed.

12. The priority determination circuit according to claim 10, wherein the plurality of microcontrollers are configured to initiate the operations corresponding to the response signals that are in a high state and terminate the operations corresponding to the response signals that are in a low state.

13. The priority determination circuit according to claim 10, wherein the write/read pointer output circuit is configured to output a write pointer, corresponding to any one of the request signals, in a high state during an interval from a time point at which any one of the request signals changes from a low state to a high state to a time point at which a delayed request signal corresponding to any one of the request signals changes from a low state to a high state.

14. The priority determination circuit according to claim 13, wherein the write/read pointer output circuit is configured to, when a write pointer in a high state, corresponding to any one of the request signals, is received, change data corresponding to the write enable signal.

15. The priority determination circuit according to claim 14, wherein the FIFO register is configured to, whenever a write pointer in a high state, corresponding to any one of the request signals, is received, store each of pieces of data in each of registers.

16. The priority determination circuit according to claim 15, wherein the FIFO register is configured to, when data corresponding to the write enable signal changes, output stored data based on the write pointer in a high state in response to the write enable signal.

17. The priority determination circuit according to claim 16, wherein the write/read pointer output circuit is configured to output a write pointer, corresponding to any one of the request signals, in a high state during an interval from a time point at which any one of the request signals changes from a high state to a low state to a time point at which a delayed request signal corresponding to any one of the request signals changes from a high state to a low state.

18. The priority determination circuit according to claim 17, wherein the write/read pointer output circuit is configured to, when a read pointer in a high state, corresponding to any one of the request signals, is received, change data corresponding to the read enable signal.

19. The priority determination circuit according to claim 18, wherein the multiplexer is configured to:

output register data, previously received from the FIFO register, as the FIFO data until data corresponding to the read enable signal changes, and output register data, received from the FIFO register, as the FIFO data when the data corresponding to the read enable signal changes.

* * * * *